(12) United States Patent
Ausserlechner

(10) Patent No.: US 7,474,093 B2
(45) Date of Patent: Jan. 6, 2009

(54) MAGNETIC FIELD SENSOR APPARATUS

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/860,959

(22) Filed: Sep. 25, 2007

(65) Prior Publication Data

US 2008/0074108 A1  Mar. 27, 2008

(30) Foreign Application Priority Data

Sep. 25, 2006  (DE) ........................ 10 2006 045 141

(51) Int. Cl.
*G01R 33/02* (2006.01)
*G01R 33/07* (2006.01)
*G01B 7/00* (2006.01)
*G01L 1/12* (2006.01)
*G01B 7/30* (2006.01)

(52) U.S. Cl. ................ 324/244; 324/207.14; 324/207.2; 324/251; 73/779

(58) Field of Classification Search ............ 324/207.14, 324/207.2, 207.25, 244, 251, 252; 702/130, 702/138, 145; 73/766–767, 774, 777, 779
See application file for complete search history.

(56) References Cited

U.S. PATENT DOCUMENTS 6,008,643 A  12/1999  Mani et al.

| 7,255,010 B2 | 8/2007 | Ausserlechner |
| 2005/0162160 A1 | 7/2005 | Ausserlechner et al. |
| 2006/0286688 A1 | 12/2006 | Ausserlechner |
| 2007/0063309 A1 | 3/2007 | Ausserlechner |

FOREIGN PATENT DOCUMENTS

| DE | 101 54 498 A1 | 5/2003 |
| DE | 694 32 102 T2 | 12/2003 |
| DE | 103 39 939 A1 | 4/2005 |
| DE | 10 2004 003 853 A1 | 8/2005 |

*Primary Examiner*—Bot LeDynh
(74) *Attorney, Agent, or Firm*—Slater & Matsil, L.L.P.

(57) ABSTRACT

A magnetic field sensor apparatus includes a first magnetic field sensor and a second magnetic field sensor, arranged on a substrate in a spaced manner from each other, a first temperature sensor with an output for a first temperature sensor signal, a second temperature sensor with an output for a second temperature sensor signal, a first stress sensor with an output for a first stress sensor signal, and a second stress sensor with an output for a second stress sensor signal, wherein the first temperature sensor and the first stress sensor are arranged more closely to the first magnetic field sensor or at a location identical with the first magnetic field sensor, and the second temperature sensor and the second stress sensor are arranged more closely to the second magnetic field sensor than to the first magnetic field sensor or at a location identical with the second magnetic field sensor.

24 Claims, 6 Drawing Sheets

MAGNETIC FIELD SENSOR APPARATUS

This application claims priority from German Patent Application No. 10 2006 045 141.4, which was filed on Sep. 25, 2006, and is incorporated herein in its entirety by reference.

TECHNICAL FIELD

An embodiment of the present invention relates to a magnetic field sensor apparatus on a substrate, and particularly to a magnetic field sensor apparatus comprising two magnetic field sensors.

BACKGROUND

For determining a position and/or a rotation direction of a transmitting object, such as a permanent magnet, angular sensors on the basis of Hall probes and/or on the basis of magnetic field probes are employed. To this end, several Hall probes are placed in the corners on a chip. If the transmitting object and/or the permanent magnet is rotated above the chip, the Hall probes arranged on the chip each detect a different field and are capable of calculating the angular position of the magnet on the basis of the detected fields. Since the Hall probes depend on detecting the inhomogeneity of the magnetic field, the Hall probes are arranged at great distance from each other on the chip.

By the arrangement of the Hall probes at great distance from each other, however, a bad or unfavorable matching results, so that the Hall probes have deviations from each other in their magnetic sensitivities. Since a relationship of two magnetic fields present at the respective probe locations is determined in the calculation of an angle, angle errors may develop as a result of the variation in magnetic sensitivity and of the unfavorable matching. During calibration of an angular sensor, one-time mismatches, which remain constant, of the Hall probes or probes can indeed be determined, and the disturbing quantities measured indeed be filed, e.g., in an EEPROM (electrically erasable programmable read-only memory), wherein the mismatches and/or disturbing quantities can be eliminated by downstream digital signal processing when employing the Hall probe arrangement.

But if a mismatch of the probes or Hall sensors changes over the life and/or operation of the Hall probe arrangement, an error can occur as a result of the varying magnetic sensitivities of the Hall probes that cannot be eliminated. The most common causes for a drift of the magnetic sensitivity of the Hall probes over their lives consist in a changing mechanical stress at the Hall probe arrangement or a changing temperature at the Hall probe arrangement. It is not the absolute values of a stress or a mechanical stress at the respective Hall probes on the chip or a temperature at the respective Hall probes on the chip that are of particular importance for a life drift of the magnetic sensitivity of the Hall probes, but a difference in the mechanical stress at the respective Hall probes changing over the on-time or life of the Hall probe arrangement or a changing difference in the temperatures at the respective Hall probes.

SUMMARY OF THE INVENTION

A magnetic field sensor arrangement has a first magnetic field sensor and a second magnetic field sensor that are arranged in a spaced manner from each other on a substrate. A first temperature sensor has an output for a first temperature sensor signal, and a second temperature sensor has an output for a second temperature sensor signal. A first stress sensor having an output for a first stress sensor signal, and a second stress sensor with an output for a second sensor signal, wherein the first temperature sensor and the first stress sensor are arranged more closely to the first magnetic field sensor than to the second magnetic field sensor or at a location identical with the first magnetic field sensor. The second temperature sensor and the second stress sensor are arranged more closely to the second magnetic field sensor than to the first magnetic field sensor or at a location identical with the second magnetic field sensor.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

Figure 1:
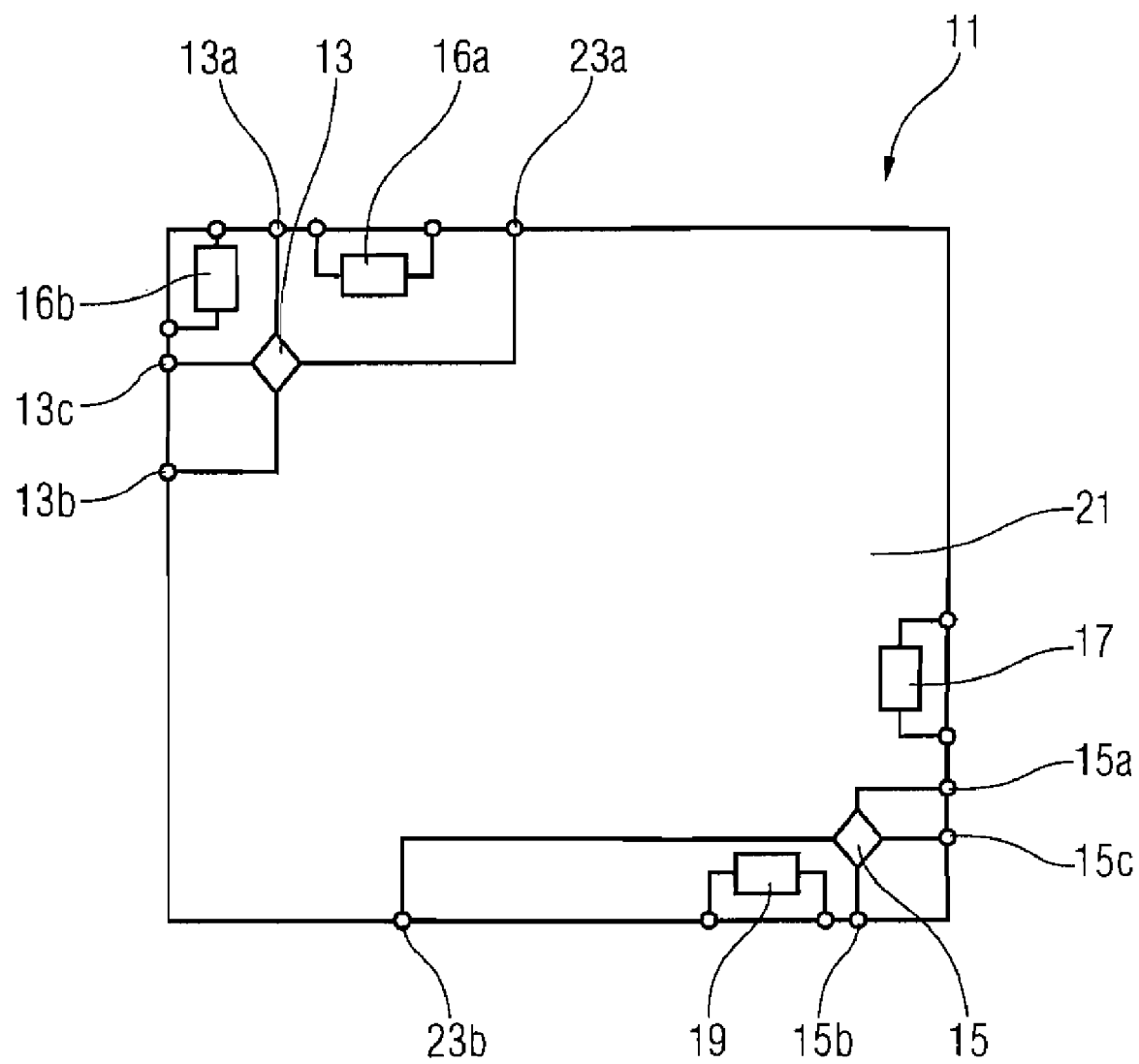
FIG. 1 shows a magnetic field sensor apparatus according to a first embodiment of the present invention.

In FIG. 1, a principle sketch of a magnetic field sensor apparatus 11 according to a first embodiment of the present invention is shown. The magnetic field sensor apparatus 11 according to a first embodiment of the present invention comprises a first magnetic field sensor 13, a second magnetic field sensor 15, a first stress sensor 16a, a first temperature sensor 16b, a second stress sensor 17 and a second temperature sensor 19. The first magnetic field sensor 13 may here be implemented as the first Hall sensor 13 and the second magnetic field sensor 15 as the second Hall sensor 15. The first Hall sensor 13, the second Hall sensor 15, the first stress sensor 16a, the first temperature sensor 16b, the second stress sensor 17 and the second temperature sensor 19 are arranged on a substrate 21.

The first stress sensor 16a and the first temperature sensor 16b are arranged closer to the first Hall sensor 13 than to the second Hall sensor 15. A distance between the first stress sensor 16a and the first Hall sensor 13 may be so small that a difference between a stress at the first stress sensor 15a and a stress at the first Hall sensor 13 lies in a range of less than 0.2 times a difference between the stress at the first Hall sensor 13 and a stress at the second Hall sensor 15. At the same time, a distance between the first temperature sensor 16b and the first Hall sensor 13 may be so small that a difference between a temperature at the first temperature sensor 16b and a temperature at the first Hall sensor 13 lies in a range of less than 0.2 times a difference between the temperature at the first Hall sensor 13 and a temperature at the second Hall sensor 15.

Moreover, a distance between the second stress sensor 17 and the second Hall sensor 15 may be so small that a difference between a stress at the second stress sensor 17 and the stress at the second Hall sensor 15 lies in a range of less than 0.2 times a difference between the stress at the first Hall sensor 13 and the stress at the second Hall sensor 15. At the same time, a distance between the second temperature sensor 19 and the second Hall sensor 15 may be so small that a distance between a temperature at the second temperature sensor 19 and the temperature at the second Hall sensor 15 lies in a range of less than 0.2 times a difference between the temperature at the first Hall sensor 13 and the temperature at the second Hall sensor 15.

At the same time, the first stress sensor 16a and the first temperature sensor 16b and the second stress sensor 17 and the second temperature sensor 19 may each be arranged at such a small distance to each other that the first stress sensor 16a is arranged closer to the first temperature sensor 16b than to the second Hall sensor 15, and the second stress sensor 17 is arranged closer to the second temperature sensor 19 than to the first Hall sensor 13.

Here, a distance between the first stress sensor 16a and the first temperature sensor 16b may be so small that a difference between the stress at the first stress sensor 16a and the stress at the first temperature sensor 16b lies in a range of less than 0.2 times the stress difference between the stress a the first Hall sensor 13 and the stress at the second Hall sensor 15. At the same time, the distance between the first stress sensor 16a and the first temperature sensor 16b may be so small that a difference between the temperature at the first stress sensor 16a and the temperature at the first temperature sensor 16b lies in a range of less than 0.2 times the temperature difference between the temperature at the first Hall sensor 13 and the temperature at the second Hall sensor 15.

Moreover, a distance between the second stress sensor 17 and the second temperature sensor 19 may be so small that a difference between the stress at the second stress sensor 17 and the stress at the second temperature sensor 19 lies in a range of less than 0.2 times the stress difference between the stress at the first Hall sensor 13 and the stress at the second Hall sensor 15. At the same time, the distance between the second stress sensor 17 and the second temperature sensor 19 may be so small that a difference between the temperature at the second stress sensor 17 and the temperature at the second temperature sensor 19 lies in a range of less than 0.2 times the temperature difference between the temperature at the first Hall sensor 13 and the temperature at the second Hall sensor 15.

The first Hall sensor 13 is connected between a first Hall current terminal 13a of the first Hall sensor 13 and a second Hall current terminal 13b of the first Hall sensor 13, via which a current is impressed through the first Hall sensor 13. At the same time, the first Hall sensor 13 is electrically connected to a first Hall voltage tap 13c of the first Hall sensor 13 and a second Hall voltage tap 23a of the first Hall sensor 13, at which a Hall voltage, generated by the first Hall sensor 13, is tapped between the first Hall voltage tap 13c and the second Hall voltage tap 23a of the first Hall sensor 13.

The second Hall sensor 15 is connected between a first Hall current terminal 15a of the second Hall sensor 15 and a second Hall current terminal 15b of the second Hall sensor 15, so that a Hall current flowing through the second Hall sensor 15 is impressed via the Hall current terminal 15a, 15b. A Hall voltage generated by the second Hall sensor 15 is tapped between a first Hall voltage tap 15c of the second Hall sensor 15 and a second Hall voltage tap 23b of the second Hall sensor 15.

In the magnetic field sensor apparatus 11 according to a first embodiment of the present invention, the first stress sensor 16a and the first temperature sensor 16b are each connected via lines to terminals on the chip implemented on the substrate 21, so that the magnetic field sensor apparatus 11 provides, at the terminals, a first stress measurement signal or first stress sensor signal generated by the first stress sensor 16a and provides a first temperature measurement signal or first temperature sensor signal generated by the first temperature sensor 16b. The terminals or the lines may be insulated from the substrate 21 by pn junctions. At the same time, in the magnetic field sensor apparatus 11 according to a first embodiment of the present invention, the second stress sensor 17 and the second temperature sensor 19 each are connected via lines to the terminals on the chip implemented on the substrate 21, so that the magnetic field sensor apparatus 11 provides, at the terminals, a second stress measurement signal or second stress sensor signal generated by the second stress sensor 17 and provides a second temperature measurement signal or second temperature sensor signal generated by the second temperature sensor 19, wherein the terminals or the lines may be insulated from the substrate 21, as already explained above.

The magnetic field sensor apparatus 11 according to a first embodiment of the present invention thus provides, apart from output signals of the Hall sensors 13, 15, which are tapped as voltages between the terminals 13c, 23a and 15c, 23b, respectively, also the first temperature measurement signal, the first stress measurement signal, the second temperature measurement signal and the second stress measurement signal. In a downstream evaluation means not shown in FIG. 1, based on the output signals of the Hall sensors 13, 15, the temperature measurement signals and the stress measurement signals, a relation or relationship between a magnetic field at the first Hall sensor 13 and the second Hall sensor 15 thus may be determined.

Since the magnetic field sensor apparatus 11 according to a first embodiment of the present invention additionally provides the temperature measurement signals and the stress measurement signals at the terminals on the substrate 21, the evaluation means downstream to the magnetic field sensor apparatus 11 may calculate out an influence of the temperature differences of the temperatures at the first Hall sensor 13 and at the second Hall sensor 15 in the magnetic field sensor apparatus 11 and/or an influence of the stress differences of the stress at the first Hall sensor 13 and the stress at the second Hall sensor 15 in a determination of a relation of a value of a magnetic field at the first Hall sensor 13 to a value of the magnetic field at the second Hall sensor 15, so that an influence of the disturbing quantities of the temperature difference and of the difference of the mechanical stresses in the magnetic field sensor apparatus 11 according to one embodiment of the present invention on the determined relation between the magnetic field at the first Hall sensor 13 and the magnetic field at the second Hall sensor 15 is reduced.

In other words, the disturbing quantities of temperature difference and/or stress difference at the magnetic field sensor apparatus 11 according to a first embodiment of the present invention may thus be compensated for computationally in the downstream evaluation means.

The Hall sensor apparatus 11 according to a first embodiment of the present invention hence additionally provides information on the disturbing quantities of the difference of the mechanical stresses and of the temperatures of the Hall sensor apparatus 11, which may at least partially be calculated out in the downstream evaluation means, wherein the evaluation means may multiply the ratio of the values of the output signals of the Hall sensors 13, 15 by a rational function. The rational function may then, for example, consist of a numerator and a denominator polynomial of fixed coefficients and powers of the temperature differences and of the stress differences. Thus, the magnetic field sensor apparatus 11 allows for precise measurement of a relation between the magnetic fields at the first Hall sensor 13 and the second Hall sensor 15 over a life of the magnetic field sensor apparatus 11. After all, an influence of the temperature differences changing over the life of the Hall sensor apparatus 11 or the stress differences changing over the life at the Hall sensors 13, 15 on the determined relation is smaller, so that the Hall sensor apparatus 11 may at the same time determine with higher reliability, over its life, a relation between the magnetic field present at the first Hall sensor 13 and a magnetic field present at the second Hall sensor 15.

Thus, the magnetic field sensor apparatus 11 according to a first embodiment may, for example, sense an angle of a magnetic field with a deviation of less than 1° by being able to calculate out the changing disturbing quantities, such as the temperature differences and stress differences at the Hall sensor apparatus 11 according to a further embodiment of the present invention, when determining the angle of the magnetic field. It is particularly advantageous in the Hall sensor apparatus 11 according to an embodiment of the present invention that it can be realized in a simple manner by implementation of the Hall sensors 13, 15, the stress sensors 16a, 17 and the temperature sensors 16b, 19 on the substrate 21, wherein the components mentioned may be produced by means of stable FE (front end) processes, and chips on which these elements 13, 15, 16a, 16b, 17, 19 are implemented thus have a high yield in fabrication, as well as are characterized by a corresponding robustness or insensitivity to fabrication fluctuations or fluctuations in the fabrication process. Here, for the production of the components mentioned, only a small number of masks are needed, leading to short turnaround times in the fabrication and, in turn, to low production costs.

The magnetic field sensor apparatus 11 according to one embodiment of the present invention here enables a hysteresis-free determination of a relation between a magnetic field at the first Hall sensor 13 and a magnetic field at the second Hall sensor 15, and hence a hysteresis-free determination of an angle of the magnetic field, which is particularly advantageous as opposed to conventional AMR (anisotropic magnetoresistive) systems or GMR (giant magnetoresistive) systems, in which the corresponding hysteresis effects are to be taken into account in the determination of an angle of a magnetic field.

In the following, a construction of a magnetic field sensor apparatus 51 according to a second embodiment of the present invention will be explained in FIG. 2. The magnetic field sensor apparatus 51 or Hall sensor apparatus 51 according to an embodiment of the present invention comprises a first Hall sensor 53, a second Hall sensor 55, a first stress sensor 57, a second stress sensor 59, a first temperature sensor 61, a second temperature sensor 63, a difference calculation means 65, a first analog-digital converter 67, a second analog-digital converter 69, a DSP (digital signal processor) 71, an adjustment transistor 73, an operational amplifier 75, a reference voltage source 77 and a current mirror circuit 79.

The first Hall sensor 53 is connected at a first terminal to a first output terminal of the current mirror circuit 79 and at a second terminal to a ground terminal. Furthermore, the first Hall sensor 53 is connected at a third terminal to a first input of the second analog-digital converter 69. The second Hall sensor 55 is connected at a first terminal to a second output terminal of the current mirror circuit 79, whereas the second Hall sensor 55 is connected at a second terminal to the ground terminal in electrically conducting manner. A third terminal of the second Hall sensor 55 is coupled to a second input of the second analog-digital converter 69.

Figure 2:
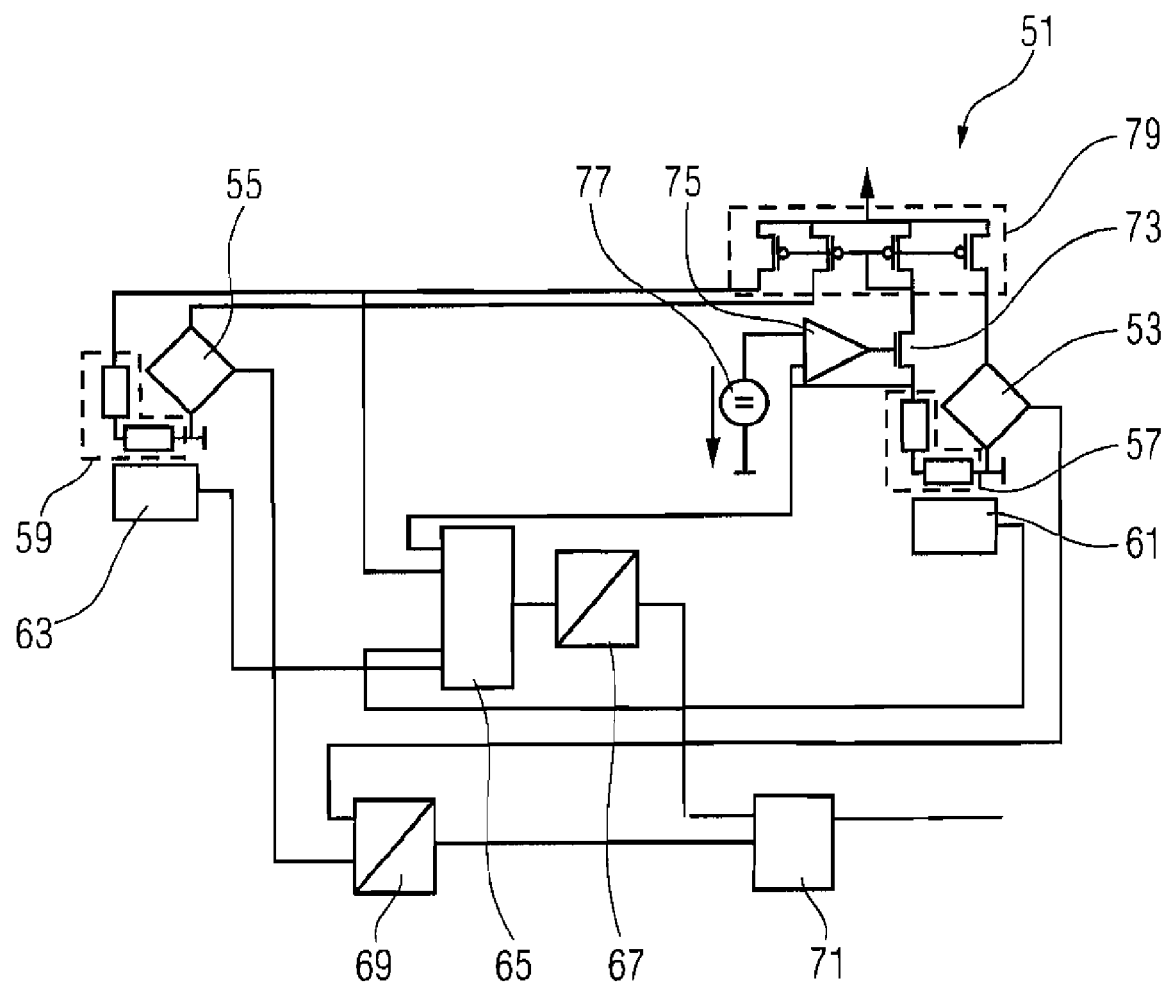
FIG. 2 shows a magnetic field sensor apparatus according to a second embodiment of the present invention.

In the Hall sensor apparatus 51 according to a second embodiment of the present invention shown in FIG. 2, the four terminals of the Hall sensors 53, 55 or the connections thereof may each be exchanged diagonally pair by pair, so that opposite terminals are connected to the ground terminal and the output terminal of the current mirror via changeover switches not shown here in a first clock phase, and are coupled to the first input of the second analog-digital converter 69 and the ground terminal in a second, ensuing clock phase. This principle of switching over the terminals of the Hall sensors 53, 55, wherein a switch may be associated with each terminal, will be explained in greater detail later, above all in the Hall sensor apparatus 51 shown in FIG. 3.

A first terminal of the first stress sensor 57 is connected to a first terminal of the operational amplifier 75, a first terminal of the adjustment transistor 73 and a first terminal of the difference calculation means 65. A second terminal of the first stress sensor 57 is coupled to the ground terminal. A second terminal of the adjustment transistor 73 is coupled to an input terminal of the current mirror circuit 79, whereas a control terminal of the adjustment transistor 73 is connected to an output of the operational amplifier 75. The current mirror circuit 79 consists of four current mirror transistors each connected to each other at a first terminal and at a control terminal, whereas the input terminal of the current mirror circuit 79 is coupled to the respective control terminals of the current mirror transistors. A second input of the operational amplifier 75 is connected to a first terminal of the reference voltage source 77, whereas a second terminal of the reference voltage source 77 is coupled to the ground terminal. In order to attain a more precise impression of the Hall current into the sensors 53, 55, 59, the respective current mirrors are cascoded in the current mirror circuit 79 or connected together in cascodes.

A first terminal of the second stress sensor 59 is coupled to a third output terminal of the current mirror circuit 79 and a second input of the difference calculation means 65, whereas a second terminal of the second stress sensor 59 is connected to the ground terminal in conducting manner.

An output of the first temperature sensor 61 is connected to a third input of the difference calculation means 65, whereas an output of the second temperature sensor 63 is coupled to a fourth input of the difference calculation means 65. An output of the difference calculation means 65 is connected to an input of the first analog-digital converter 67 in a conducting manner, whereas an output of the first analog-digital converter 67 is coupled to a first input of the DSP 71. An output of the second analog-digital converter 69 is connected to a second input of the DSP 71. The DSP 71 provides, at an output, an output signal of the Hall sensor apparatus 51 according to a second embodiment of the present invention.

The operational amplifier 75 is connected as a comparator and serves to adjust a current $I_0$ through the first stress sensor 57 via a potential at the control terminal of the adjustment transistor 73 so that a voltage drop at the first stress sensor 57 corresponds to a voltage $U_0$ of the reference voltage source 77. The current mirror circuit 79 adjusts the current at the first to third output terminals so that the currents at the first output terminal, the second output terminal and the third output terminal are proportional to the current $I_0$, wherein the current at the first output terminal and the second output terminal is established so that it is the same each, for example, or may be within a tolerance of about 2% of a value of the current at the input terminal of the current mirror circuit 79. Thus, the currents impressed on the first Hall sensor 53 and the second Hall sensor 55 are equal to the current $I_0$, and the current impressed on the second stress sensor 59 is proportional to the current $I_0$ through the first stress sensor 57. In other words, the current $I_0$ is employed for a scaled supply of the Hall sensors 53, 55 and the stress sensors 57, 59, wherein the currents through the two stress sensors 57, 59 may advantageously be identical or equal. The reference voltage $U_0$ thus is copied onto the first stress sensor 57, which has a first ohmic resistor, the resistance of which depends on a temperature $T_1$ and a stress $\sigma_1$ at the first Hall sensor 53.

The first Hall sensor 53 provides an output signal $S_{h,1}$, the value of which depends on a magnetic field present at the first Hall sensor 53 and a Hall current $I_0$ flowing through the first Hall sensor 53. The second Hall sensor 55 provides an output signal $S_{h,2}$, the value of which depends on a magnetic field present at the second Hall sensor 55 and the Hall current $I_0$ flowing through the second Hall sensor 55. The first stress sensor 57 provides an output signal $S\sigma_1$, the value of which depends on the mechanical stress $\sigma_1$ present at the first Hall sensor 53. The second stress sensor 59 provides an output signal $S\sigma_2$, the value of which depends on the mechanical stress $\sigma_2$ present at the second Hall sensor 55. The first temperature sensor 61 provides an output signal ST1, the value of which depends on the temperature $T_1$ at the first Hall sensor 53. The second temperature 63 provides an output signal ST2, the value of which depends on a temperature $T_2$ at the second Hall sensor 55.

The difference calculation means 65 determines a difference of the values of the output signal $S\sigma_2$ of the second stress sensor 59 and of the output signal $S\sigma_1$ of the first stress sensor 57 on the one hand, and a difference of the values of the output signal $S_{T2}$ of the second temperature sensor 63 and of the output signal $S_{T1}$ of the first temperature sensor 61 on the other hand. The difference calculation means 65 then adjusts, at its output, a value of the output signal of the difference calculation means 65 so that its value depends on the difference of the output signals $S\sigma_1$, $S\sigma_2$ of the stress sensors 57, 59 in a first time interval and on a difference of the output signals $S_{T1}$, $S_{T2}$ of the temperature sensor 61, 63 in the second, ensuing time interval.

In other words, the difference calculation means 65 transmits to the first analog-digital converter 67, in temporally multiplexed form, a first difference signal $(S\sigma_2-S\sigma_1)$, the value of which depends on the difference of the output signals $S\sigma_1$, $S\sigma_2$ of the stress sensors 57, 59, and a second difference signal $(S_{T2}-S_{T1})$, the value of which depends on the difference of the output signals $S_{T1}$, $S_{T2}$ of the temperature sensors 61, 63. The first analog-digital converter converts the two temporally multiplexed analog difference signals $(S\sigma_2-S\sigma_1)$, $(S_{T2}-S_{T1})$ each into a digital value and transmits a digital value of the first difference signal and a digital value of the second difference signal each to the DSP 71 in temporally multiplexed form and/or in a temporal sequence.

Employment of a single analog-digital converter or a single A/D converter in a time multiplex operation is impossible in the Hall sensor apparatus 51, because the temperatures at the temperature sensors 61, 63 and the mechanical stresses at the stress sensor 57, 59 change in a significantly slower way than the magnetic field sensed by the Hall sensor apparatus 51 according to a second embodiment. Hence, a detection of the differences between the signals from the temperature sensors 61, 63 and the signals from the stress sensors 57, 59 is uncritical with respect to time.

The second analog-digital converter 69 determines a relation or a quotient of the value of the output signal $S_{h,2}$ of the second Hall sensor 55 to the value of the output signal $S_{h,1}$ of the first Hall sensor 53, and converts the quotient value thus determined into a digital quotient value. The digital quotient value is then also transmitted to the DSP 71.

The DSP 71 then determines an angle of the magnetic field at the second Hall sensor 55 based on the digital quotient value and the digital value of the first difference signal $(S\sigma_2-S\sigma_1)$ and the digital value of the second difference signal $(S_{T2}-S_{T1})$. Here, it is advantageous that the DSP 71 can take the influences of the temperatures $T_1$, $T_2$ and of the mechanical stresses $\sigma_1$, $\sigma_2$ at the Hall sensors 53, 55 into account in the determination of the magnetic field at the second Hall sensor 55, so that an influence of the disturbing quantities $T_1$, $T_2$, $\sigma_1$, $\sigma_2$ can be calculated out at least partially in the determination of the angle of the magnetic field. In other words, in the determination of the angle of the magnetic field at the second Hall sensor 55, which may, for example, be done by means of a differential principle, the disturbing influences of the differences in the temperature $T_1$, $T_2$ and the mechanical stresses $\sigma_1$, $\sigma_2$ at the Hall sensors 53, 55 are compensated for by suitable computational measures in the DSP 71.

In summary, it can be stated that the Hall sensor apparatus 51 according to a second embodiment of the present invention determines the stress and temperature difference of the Hall sensors 53, 55, which are located, e.g., far from each other and are arranged on a chip not shown here, and then determines an influence of the differences thus determined on the magnetic sensitivities of the Hall sensors 53, 55 or the Hall probes 53, 55. These influences are then finally calculated out again in the signal processing in the DSP 71. The Hall sensor apparatus 51 hence does not perform post-regulation of an input quantity, such as the Hall currents through the Hall sensors 53, 55, but senses the disturbing quantities and determines the value of the angle of the magnetic field at the second Hall sensor 55 in a correction computation according to a fixed formula.

In the following, a deduction of the correction formula with which the DSP 71 calculates out the influence of the disturbing quantities will be explained. The first Hall sensor 53 or the first probe serves for determining a reference quantity in the Hall sensor apparatus 51, so that the signal $S_{h,1}$ provided from the first Hall sensor 53 serves as reference quantity for the angle calculation of the magnetic field at the second Hall sensor 55. The value of the output signal of the first Hall sensor 53 here is in a denominator of a formula from which the DSP 71 determines the angle of the magnetic field using an arc tangent computation or arc tangent function. The output signal $S_{h,2}$ of the second Hall sensor 55 or the second probe here is in the numerator of the formula.

In the determination of the following equations, it is assumed that the first stress sensor 57 and the first temperature sensor 61 are arranged closely to the first Hall sensor 53 in the layout, and the second stress sensor 59 and the second temperature sensor 63 are arranged closely to the second Hall sensor 55, so that the disturbing quantities sensed by the sensors 53, 57, 59, 63 correspond to the disturbing quantities at the Hall sensors 53, 55. The stress sensors 57, 59 here are implemented as two n-doped diffusion/implantation resistors arranged perpendicularly to each other each in the layout in a (100)-silicon substrate, so that the stress sensors 57, 59 are implemented as ohmic resistors, which consist of two nominally equal sub-resistors, wherein the sub-resistors are connected in series in the Hall sensor apparatus 51 according to a second embodiment of the present invention. It is advantageous in the implementation of the stress sensors 57, 59 in such a manner that both the two n-doped Hall sensors 53, 55 and the stress sensors 57, 59 implemented as ohmic resistors each react to the same linear combination of tensor components of the mechanic stress or the mechanic tension state, namely the sum of the main axis tensions. The tensor components are the main axis tensions $\sigma_{xx}$, $\sigma_{yy}$ in a chip plane perpendicular to a chip thickness, wherein the Hall sensors 53, 55 react to the sum of the main axis tensions $\sigma_{xx}$, $\sigma_{yy}$ in similar manner to the stress sensors 57, 59 or the stress resistors underlying the same.

Here, the following connection applies for a value of the resistor $R_n$ of the stress sensors 57, 59:

$$R_n = R_{n,0}(1+\pi_n \sigma) \quad (1)$$

In the above formula, $R_n$ represents a resistance value of the n-doped resistor of the stress sensors 57, 59, whereas $R_{n,0}$ represents a value of the ohmic resistor when no mechanical stress is present at the stress sensors 57, 59. The variable $\pi_n$ represents a piezoresistive coefficient of the Hall sensor apparatus 51 dependent, among other things, on a material of the substrate.

$\sigma$ represents a sum of the main axis tensions in the chip plane, wherein the following connection applies:

$$\sigma = \sigma_{xx} + \sigma_{yy} \quad (2)$$

$\sigma_{xx}$, $\sigma_{yy}$ here represent the respective normal tensions perpendicular to a chip thickness, wherein the sum of the quantities $\sigma_{xx}$, $\sigma_{yy}$ is independent of the fact how the x-y axes are twisted in the chip plane. The normal tensions $\sigma_{xx}$, $\sigma_{yy}$ indeed change upon rotation of the coordinate cross, but not the sum of the normal tensions. For a value $S_{i,0}$, which expresses a current-related magnetic sensitivity of the Hall probe or the Hall sensors 53, 55 depending on a piezo Hall coefficient P, the following connection applies:

$$S_i = S_{i,0}(1+P\sigma) \quad (3)$$

In the Hall sensor apparatus 51, which is arranged on a (100)-silicon substrate, the fact that the n-doped resistors of the two stress sensors 57, 59 have the highest piezoresistive effect in the (100)-silicon substrate applies, wherein a value of the piezoresistive coefficient $\pi_n$ lies at about −24.4%/Gpa in the (100)-silicon substrate. Hence, in the Hall sensor apparatus 51 according to a second embodiment of the present invention, advantageously n-doped resistors are employed. The Hall sensors 53, 55 themselves also are implemented as n-doped zones on the silicon substrate, since this form of implementation has the highest magnetic sensitivity.

A stress dependence of the magnetic sensitivity of the Hall sensors 53, 55 in the (100)-silicon substrate is even higher, with a value of the piezo Hall coefficient P lying at about 44%/Gpa. For Hall sensor apparatuses in which the Hall sensors 53, 55 are implemented in an n-doped zone on a (100)-silicon substrate, the fact applies that the ohmic resistors in which the stress sensors 57, 59 are implemented are to have as-high-as-possible a stress dependence of the ohmic resistors, wherein an ideal value for the piezoresistive coefficient of the ohmic resistors would be about 44%/Gpa, so that a stress dependence of the ohmic resistance of the stress sensors 57, 59 would be equal to a stress dependence of the Hall sensors 53, 55.

In the Hall sensor apparatus 51, in which both the ohmic resistors of the stress sensors 57, 59 and the active areas of the Hall sensors 53, 55 are implemented as n-doped zones, it is advantageous that a current proportional to the current $I_0$ through the Hall sensors 53, 55 can be impressed on the stress sensors 57, 59, so that an influence of possible process scatterings on the electric behavior of the Hall sensor apparatus 51, and particularly on the determined angle of the magnetic field, does not have to be taken into account, wherein the current, as already explained, is adjusted by the Hall sensors 53, 55 depending on the values of the ohmic resistor of the first stress sensor 57.

Since the first Hall sensor 53, the first stress sensor 57 and the first temperature sensor 61 are arranged closely to each other in a first sensor group I, and the second Hall sensor 55, the second stress sensor 59 and the second temperature sensor 63 are arranged closely to each other in a second sensor group II, in the Hall sensor apparatus 51 according to the second embodiment of the present invention, the fact applies that at the sensors 53, 57, 61 of the first sensor group I the first temperature $T_1$ and the first mechanical stress $\sigma_1$ are present, and at the sensors 55, 59, 63 in the second sensor group II the temperature $T_2$ and the mechanical stress $\sigma_2$ are present. For a difference $U\sigma$ of the voltage drops at the stress measurement resistors $R_{n1}$, $R_{n2}$ of the stress sensors 57, 59, the following connection applies:

$$U_\sigma = U_0 - U_0 \frac{R_{n2}(T_2, \sigma_2)}{R_{n1}(T_1, \sigma_1)} \quad (4)$$

In equation (4), $R_{n1}$ represents a value of the ohmic resistor of the first stress sensor 57, $R_{n2}$ a value of the ohmic resistors of the second stress sensor 59, and $U_0$ of the voltage of the reference voltage source 77. Equation (4) may also be written as follows:

$$U_\sigma = U_0\left(1 - \frac{R_{n2,0}}{R_{n1,0}} \frac{1+\varepsilon(T_2)}{1+\varepsilon(T_1)} \frac{1+\pi_n(T_2)\sigma_2}{1+\pi_n(T_1)\sigma_1}\right) \quad (5)$$

Here, $R_{n1,0}$, $R_{n2,0}$ each represent a value of the resistor or ohmic resistor $R_{n1}$ of the first stress sensor 57 and an ohmic resistor $R_{n2}$ or stress measurement resistor of the second stress sensor 59 each at a reference temperature and a reference stress. A variable $\epsilon(T)$ here each represents a temperature dependence of the ohmic resistors of the stress sensors 57, 59 at the temperatures $T_1$, $T_2$ present at the stress sensors 57, 59, whereas the term $\pi_n(T_2)*\sigma_2$ indicates the piezoresistive dependence of the resistor $R_{n2}$ and the term $\pi_n(T_1)*\sigma_1$ the piezoresistive dependence of the resistor Rn1 at the respective values of the temperature-dependent piezoresistive coefficient $\pi_n(T_2)$ and $\pi_n(T_1)$.

Following linearization of the equation (5), for a value of a digital difference signal provided from the first analog-digital converter 67 and depending on a value of the difference of the voltage drops at the stress sensors 57, 59 and/or proportional to a difference of the voltage drops, one finally obtains the following connection:

$$S_\sigma = \mu_\sigma + \epsilon'(T_2 - T_1) + \pi_n(T)(\sigma_2 - \sigma_1) \quad (6)$$

In equation (6), $\mu_\sigma$ represents the digital value arising at an initial mismatch of the stress measurement resistors $R_{n1}$, $R_{n2}$, that is the value $\mu_\sigma$ represents the initial digital value of the difference signal $S_\sigma$ when a difference in the mechanical tensions at the stress sensors 57, 59 as a result of a life drift is not present yet. Here, also an initial disturbing influence of the PMOS current mirror circuit 79 is considered in the variable $\mu_\sigma$. In a Hall sensor apparatus 51 according to a further embodiment, the initial mismatch is reduced below a perception threshold by corresponding layout measures, or the initial mismatch is determined within the scope of a calibration measurement of the Hall sensor apparatus 51 and deposited as a digital value in a memory, such as an EEPROM, and read out and taken into account in temporally subsequent computations. The value $\epsilon'$ represents a temperature dependence of the value of the stress sensor difference signal $S_\sigma$ provided from the second analog-digital converter 69. The remaining variables $T_2$, $T_1$, $\pi_n$ (T), $\sigma_2$, $\sigma_1$ and their meaning already have been explained above. For simplification, it was assumed for a determination of the equation (6) that the first analog-digital converter 67 uses the reference voltage $U_0$ in the digitization of the input signal $U_\sigma$.

In the determination of the equation (6), it is also assumed for simplification that an influence of the temperature difference between the first stress sensor 57 and the second stress sensor 59 is small, so that the temperature difference between the first stress sensor 57 and the second stress sensor 59 can be neglected in a determination of the piezoresistive coefficient $\pi_n$(T), and in equation (6) a mean chip temperature T of the chip on which the Hall sensor apparatus 51 according to a second embodiment of the present invention is arranged can be employed for the determination of the value of the piezoresistive coefficient $\pi_n$. This assumption may particularly also be made because a difference in temperatures $T_1$, $T_2$ does only show as a higher-order error in the determination of the piezoresistive coefficient $\pi_n$.

From equation (6), it thus becomes obvious that the digital value $S_\sigma$ of the stress sensor difference signal is dependent on a difference of the mechanical stress at the first Hall sensor 53 and at the second Hall sensor 55, wherein the value $S_\sigma$ of the digital stress sensor difference signal, however, still has a temperature error resulting from a difference in temperatures at the first Hall sensor 53 and the second Hall sensor 55.

In the following, it will be explained how the temperature error, which, among other things, corrupts the value of the signal $S_\sigma$ and influences and/or corrupts the determined relation of the magnetic fields at the Hall sensors 53, 55, can be compensated for and/or calculated out. To this end, a digital value of a temperature sensor difference signal $S_T$ is taken into account, which depends on a difference $U_T$ of the voltages at the temperature sensors 61, 63. The temperature sensors 61, 63, for example, each are implemented as PTAT (Proportional-to-Absolute-Temperature) bandgap cores. The temperature sensors 61, 63 thus each adjust a voltage between their output terminals and the ground terminal proportional to the absolute temperature present thereat. Thus, the voltage difference UT, in first approximation, is proportional to the difference in temperatures $T_2$, $T_1$.

What is to be taken into account, however, in the determination of the digital value of the signal $S_T$ is a mismatch of the temperature sensors 61, 63 and/or the PTAT bandgaps PTAT1 and PTAT2, which do influence the difference signal $U_T$, and hence the value of the digital temperature sensor difference signal $S_T$, and an influence of the different mechanical stresses or mechanical tensions at the temperature sensors 61, 63. Here, the different mechanical stresses at the temperature sensors 61, 63 have an effect via a so-called piezo junction effect of the bipolar transistors in the PTATs. By suitable layout measures in a circuit design of the Hall sensor apparatus 51 according to a second embodiment of the present invention, this mismatch can be reduced. At the same time, by suitable dimensioning of the bipolar transistors in the PTATs, an influence of the piezo junction effect can be reduced. But if the two effects cannot be reduced sufficiently by suitable layout measures, an influence of the disturbing effects on the temperature sensor difference signal $S_T$ may again be determined in a calibration measurement and deposited in an EEPROM and read out and taken into account correspondingly in the detection of the temperature difference by the DSP 71. For a value $S_T$ of the digital temperature sensor difference signal, the following connection applies:

$$S_T = \mu_T + \delta'(T_2 - T_1) + \zeta(T)(\sigma_2 - \sigma_1) \tag{7}$$

Here, in the above equation (7), the variable $\mu_T$ represents an initial mismatch of the temperature sensors 61, 63, which is dependent on a difference $U_T$ of the electric voltages of the temperature sensors 61, 63 when the same temperature is present at the temperature sensors 61, 63. Furthermore, in equation (7), the variable $\delta'$ indicates a sensitivity of the temperature sensor circuit, and hence a dependence of the value of the digital temperature sensor difference signal $S_T$ on a difference in temperatures $T_1$ and $T_2$. Furthermore, a variable $\zeta(T)$ expresses a sensitivity of the temperature sensor circuit with respect to different stresses at the two temperature sensors 61, 63, and hence a dependence of the digital temperature sensor difference signal $S_T$ on a difference between the mechanical stress $\sigma_2$ at the second temperature sensor 63 and the mechanical stress $\sigma_1$ at the first temperature sensor 61.

An equation system consisting of equations (6), (7) has the unknown elements $(T_2-T_1)$ and $(\sigma_2-\sigma_1)$. This equation system may be solved for the named unknown elements $(T_2-T_1)$ and $(\sigma_2-\sigma_1)$. Thus, the equations (8) and (9) result, in which a connection between the unknown $(T_2-T_1)$ and $S_\sigma$, $S_T$ is indicated, and a connection between the unknown $(\sigma_2-\sigma_1)$ and the quantities $S_\sigma$, $S_T$ is indicated:

$$T_2 - T_1 = \frac{(S_\sigma - \mu_\sigma)\zeta(T) - (S_T - \mu_T)\pi_n(T)}{\varepsilon'\zeta(T) - \delta'\pi_n(T)} \tag{8}$$

and $$\sigma_2 - \sigma_1 = \frac{(S_T - \mu_T)\varepsilon' - (S_\sigma - \mu_\sigma)\delta'}{\varepsilon'\zeta(T) - \delta'\pi_n(T)} \tag{9}$$

For a relation of the signals provided from the Hall sensors 53, 55 and/or their values, the following connection thus results:

$$\frac{S_{h,2}(T_2)}{S_{h,1}(T_1)} = \frac{B_2}{B_1} \frac{S_{hi,2}}{S_{hi,1}} \frac{I_0(T)}{I_0(T)} = \frac{B_2}{B_1} \frac{S_{hi,2}(T_2)}{S_{hi,1}(T_1)} \tag{10}$$

In equation (10), the variable $S_{h,2}(T_2)$ represents a value of the output signal provided from the second Hall sensor 55, whereas the variable $S_{h,1}(T_1)$ represents a value of the output signal provided from the first Hall sensor 53 or the first Hall probe. The variable $B_1$ represents a value of the B field at the first Hall sensor 53 and/or a value of the magnetic field perpendicular to a chip plane in which the Hall sensor apparatus 51 according to a second embodiment of the present invention is arranged, whereas the variable $B_2$ represents a corresponding component of the magnetic field perpendicular to the chip plane at the second Hall sensor 55. The variable $S_{hi,1}$ represents a current-related magnetic sensitivity of the first Hall sensor 53, whereas the variable $S_{hi,2}$ represents a current-related magnetic sensitivity of the second Hall sensor 55.

Furthermore, in formula (10), it was assumed that the current mirror circuit 79, as already explained above, is formed so that the same current $I_0$ is fed in the two Hall sensors 53, 55, so that the two Hall sensors 53, 55 are flown through by the same current $I_0$.

In the Hall sensor apparatus 51 according to a second embodiment of the present invention, it is advantageous that the two Hall probes 53, 55 each are flown through by the same current, so that a temperature or stress dependence of this current is irrelevant or does not have to be taken into account in a determination of the angle by the Hall sensor apparatus 51. In other words, by means of the current mirror circuit 79, any current may be impressed in the Hall sensors 53, 55, without influencing the value of the angle determined by the Hall sensor apparatus 51, wherein the Hall sensors 53, 55 may also be arranged at any locations on the chip, since the current mirror circuit 79 takes care that the current flowing therethrough is the same.

In the following, it will be assumed that the stress sensors 57, 59 are also flown through by the same current as the two Hall sensors 53, 55. This is achieved by the adjustment of the current flowing through the stress sensors 57, 59 via the current mirror circuit 79. A ratio of the current-related magnetic sensitivities $S_{hi,2}(T_2)/S_{hi,1}(T_1)$ can be achieved with this, as follows, in dependence on a piezo Hall coefficient P(T):

$$\frac{S_{hi,2}(T_2)}{S_{hi,1}(T_1)} = \frac{S_{hi0,2}(T_2)}{S_{hi0,1}(T_1)} \frac{1 + P(T_2)\sigma_2}{1 + P(T_1)\sigma_1} \quad (11)$$

$$\cong \frac{S_{hi0,2}(T_2)}{S_{hi0,1}(T_1)}(1 + P(T)(\sigma_2 - \sigma_1))$$

In equation (11), the variable $S_{hi0,1}$ represents a current-related magnetic sensitivity of the first Hall sensor 53 at a reference stress, which occurs at a time of calibration, whereas a variable $S_{hi0,2}$ represents a current-related magnetic sensitivity of the second Hall sensor 55 at the reference stress. In a similar manner to the above procedure, in which an influence of the different temperatures $T_1$, $T_2$ on the piezoresistive coefficient $\pi_n$ has been neglected, here also an influence of the small temperature difference $(T_2-T_1)$ between the two Hall sensors 53, 55 is not taken into account in the value of the piezo Hall coefficient P(T). Instead, it is assumed that the value of the piezo Hall coefficient P(T) at the two Hall sensors 53, 55 is the same, and that the value of the piezo Hall coefficient P(T) only depends on the mean chip temperature T.

The connection between the current-related magnetic sensitivities $S_{hi0,1}(T_2)$, $S_{hi0,1}(T_1)$ and the values of the current-related magnetic sensitivity $S_{hi0,2}(T)$, $S_{hi0,1}(T)$ at the mean chip temperature T can be represented as follows dependent on the temperature difference $(T_2-T_1)$:

$$\frac{S_{hi0,2}(T_2)}{S_{hi0,1}(T_1)} = [1 + K(T)](T_2 - T_1)\frac{S_{hi0,2}(T)}{S_{hi0,1}(T)} \quad (12)$$

In equation (12) set forth above, the variable $\kappa(T)$ represents a normalized differential current-related magnetic sensitivity. The variable $\kappa(T)$ can be determined according to the following formula:

$$\kappa(T) = \frac{1}{S_{hi0}(T)}\frac{\partial S_{hi0}(T)}{\partial T} \quad (13)$$

In equation (13), the variable $S_{hi0}(T)$ represents an approximated value or approximation value of the current-related magnetic sensitivity of the Hall sensors 53, 55 in the Hall sensor apparatus 51. Inserting the connection set forth in equation (12) into equation (11), one obtains equation (14), which reads as follows:

$$\frac{S_{hi,2}(T_2)}{S_{hi,1}(T_1)} \cong \frac{S_{hi0,2}(T)}{S_{hi0,1}(T)}(1 + \kappa(T)(T_2 - T_1))(1 + P(T)(\sigma_2 - \sigma_1)) \quad (14)$$

$$\cong \frac{S_{hi0,2}(T)}{S_{hi0,1}(T)}(1 + \kappa(T)(T_2 - T_1) + P(T)(\sigma_2 - \sigma_1))$$

In equation (14), the term $\kappa(T)*(T_2-T_1)*P(T)*(\sigma_2-\sigma_1)$ is neglected due to the small value that a product of the difference in disturbing quantities, namely the temperature difference $(T_2-T_1)$ and the difference in mechanical tensions $(\sigma_2-\sigma_1)$, takes on. Furthermore, the fact that a value of the ratio $S_{hi0,2}(T)/S_{hi0,1}(T)$ equals 1, except for a minor mismatch of the magnetic sensitivities of the Hall sensors 53, 55, applies for equation (14).

Equation (8) for determining the temperature difference $(T_2-T_1)$ and equation (9) for determining the difference $(\sigma_2-\sigma_1)$ of the mechanical stresses $\sigma_1$, $\sigma_2$ are inserted into equation (14), and at the same time the approximation already explained above is performed, namely so that $S_{hi0,2}(T)/S_{hi0,1}(T) \sim 1$ applies. The term thus determined is inserted into equation (10). Equation (10) then is solved for a ratio of the value $B_2$ of the magnetic field at the second Hall sensor 55 to a value $B_1$ at the magnetic field of the first Hall sensor 53, so that the connection set forth in an equation (15) results as illustrated below:

$$\frac{S_{h,2}(T_2)}{S_{h,1}(T_1)}\frac{1}{1 + \kappa(T)\frac{(S_\sigma - \mu_\sigma)\zeta(T) - (S_T - \mu_T)\pi_a(T)}{\varepsilon'\zeta(T) - \delta'\pi_n(T)} + P(T)\frac{(S_T - \mu_T)\varepsilon' - (S_\sigma - \mu_\sigma)\delta'}{\varepsilon'\zeta(T) - \delta'\pi_n(T)}} = \frac{B_2}{B_1} \quad (15)$$

Since in equation (15) the second fraction only comprises material-dependent quantities or the material parameters of the stress sensors 57, 59, the Hall sensors 53, 55 and the temperature sensors 61, 63, and the digital values of the stress sensor difference signal $S\sigma$ and of the temperature sensor difference signal $S_T$ anymore, the ratio of the values $B_2$, $B_1$ of the magnetic fields at the Hall sensors 53, 55 can be determined from the ratio of the values of the output signals of the Hall sensors $(S_{h,2}(T_2)/S_{h,1}(T_1))$ at concurrent computational compensation of the temperature difference $(T_2-T_1)$ and the difference of the mechanical tensions $(\sigma_2-\sigma_1)$.

The parameters or material parameters can be determined, e.g., in a simple manner during a characterization of the Hall sensor apparatus 51 or a fine tuning of the Hall sensor apparatus 51, and may then be deposited in a ROM (read-only memory) on the chip in binary form.

Here, it is advantageous that previous examinations show that fluctuations in a fabrication process only have little influence on the parameters filed in the ROM, and hence only have little influence on the parameters necessary for the compensation.

As already explained, the DSP 71 determines, from equation (15), a connection between the ratio of the value of the magnetic field $B_2$ to a value of the magnetic field $B_1$, while inserting, into the formula (16), the digital value of the difference signal $S\sigma$ of the stress sensors 57, 59, the digital value of the difference signal $S_T$ of the temperature sensors 61, 63, and the output signals $S_{h,2}$, $S_{h,1}$ provided from the Hall sensors 53, 55, and reading out the material parameters determined in the characterization or the fine tuning from the memory, and also inserting same into the equation (15a). The means 65, 67, 69, 71 here form a compensation circuit, which determines and calculates out the influence of the disturbing quantities, namely of the temperature difference ($T_2-T_1$) and of the stress difference ($\sigma_2-\sigma_1$) between the first Hall sensor 53 and the second Hall sensor 55, in the calculation of the angle of the magnetic field.

Figure 3A:
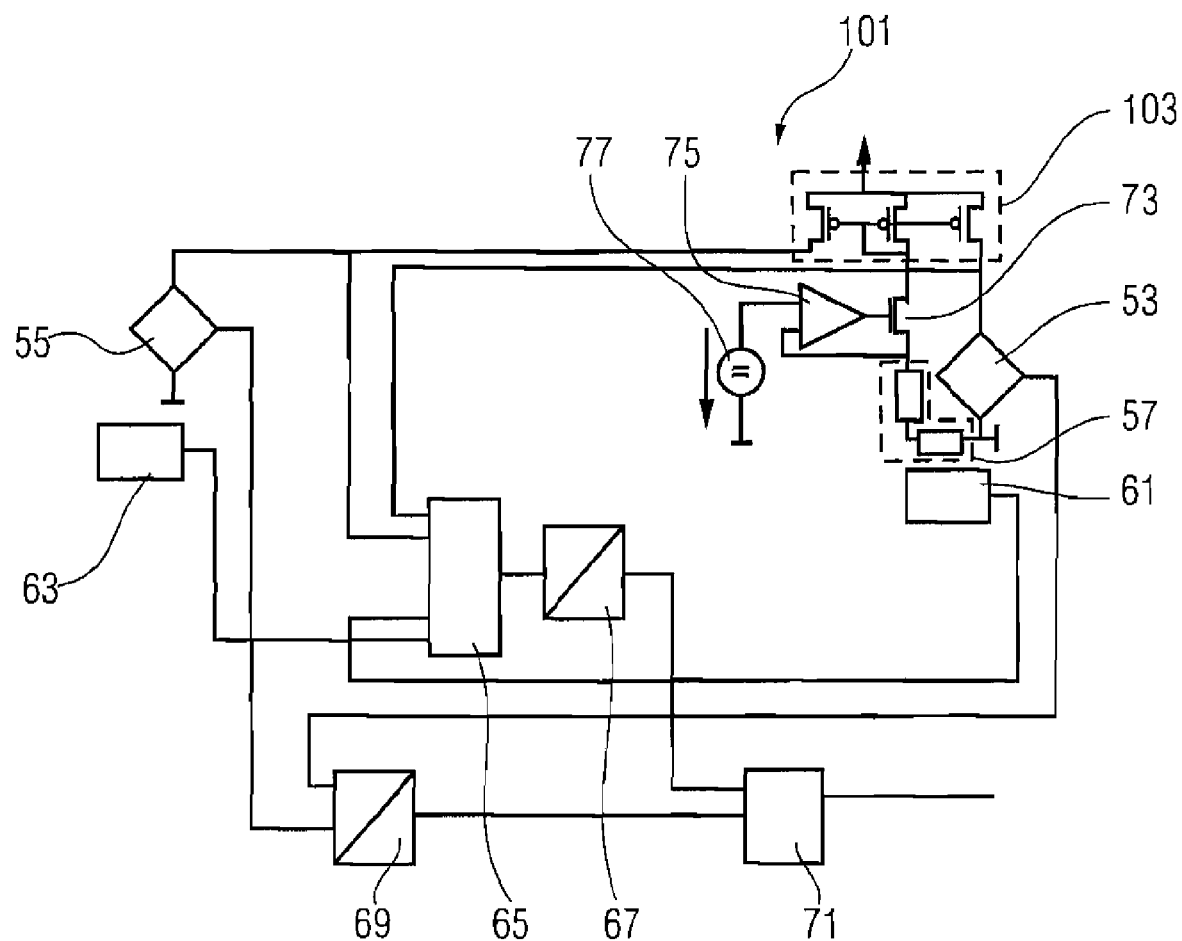
FIG. 3a shows a magnetic field sensor apparatus according to a third embodiment of the present invention.

In FIG. 3a, a magnetic field sensor apparatus 101 or Hall sensor apparatus 101 according to a third embodiment of the present invention is shown, in which the two Hall sensors 53, 55 themselves are employed for stress measurement, as will be explained in greater detail. In the following, the same or similarly acting elements with respect to the Hall sensor apparatus 51 shown in FIG. 2 are provided with the same reference numerals. Furthermore, a description of the function and of the construction of the Hall sensor apparatus 101 shown in FIG. 3 will be limited to the differences in function and construction with respect to the Hall sensor apparatus according to a second embodiment of the present invention shown in FIG. 2.

The Hall sensor apparatus 101 differs from the Hall sensor apparatus 51 according to a second embodiment of the present invention in that a further current mirror circuit 103 instead of the current mirror circuit 79 is arranged in the third Hall sensor apparatus 101.

The further current mirror circuit 103 is coupled, at an input terminal, to the second terminal of the adjustment transistor 73, whereas the second current mirror circuit is coupled, at a first output terminal, to the first terminal of the first Hall sensor 53 and, at a second output terminal, to the first terminal of the second Hall sensor 55.

Current mirror transistors arranged in the further current mirror circuit 103 are connected to each other in a conducting manner at a terminal of the current mirror transistors, and at the same time control terminals of the three current mirror transistors are coupled to each other. The first input terminal of the first difference calculation means 65 is connected to the first terminal of the first Hall sensor 53, whereas the second input terminal of the difference calculation means 65 is connected to the first terminal of the second Hall sensor 55.

The further current mirror circuit 103 serves for adjusting the first Hall current through the first Hall sensor 53 and the second Hall current through the second Hall sensor 55 so that the first Hall current and the second Hall current each are proportional to the current $I_0$ impressed at the input terminal of the further current mirror circuit 103. The Hall sensors 53, 55 at the same time function as stress sensors in the Hall sensor apparatus 101 according to a third embodiment, wherein the difference calculation means 65 determines the stress sensor difference signal from a difference of the voltage drop caused by the second Hall current at the second Hall sensor 55 and the voltage drop caused by the first Hall current at the first Hall sensor 53. It is disadvantageous in the Hall sensor apparatus 101 according to a third embodiment of the present invention that the second stress sensor 59 can be omitted as opposed to the Hall sensor apparatus 51 according to a second embodiment of the present invention, since the Hall sensors 53, 55 now themselves serve as stress sensors, as already explained.

In a further embodiment of the present invention, it is especially advantageous to provide, in the Hall sensor apparatus 101, two changeover switching means, not shown, each being connected to the Hall sensors 53, 55 and the first and second inputs of the difference calculation means 65, as well as the inputs of the second analog-digital converter 69, so that, according to a principle of a spinning current probe, the current flows, e.g., vertically through the Hall sensors 53, 55 in a first clock phase of the changeover switching means, while the current flows through the Hall sensors 53, 55 in a horizontal direction in a next clock phase or a temporally ensuing clock phase. Here, the terminal of the first Hall sensor at which the supply potential is present, or the terminal of the first Hall sensor 53 at which the higher potential is present, each is connected to the first terminal of the difference calculation means 65 through the changeover switching means, while the terminal at which the lower potential is present is connected to the first input of the second analog-digital converter 69.

In the same manner, by means of the changeover switching means, not shown, effectively connected to the second Hall sensor 55 the terminal of the second Hall sensor 55 at which the supply potential is present, each is connected to the second input of the difference calculation means 65, whereas the input at which the lower potential is present is connected to the second input of the second analog-digital converter 69. In other words, the supply signals or supply potentials at the Hall sensors 53, 55 or their connections to the first and second inputs of the difference calculation means 65 and the first input of the analog-digital converter also spin according to the spinning current method, so that the difference of the two vertical resistors of the two Hall sensors 53, 55 are determined in the difference calculation means 65 in the first clock phase, wherein the difference of the two horizontal resistors of the two Hall sensors 53, 55 are determined in the difference calculation means 65 in an ensuing phase. From the differences of the two vertical resistors and of the two horizontal resistors, a mean value is formed, which is dependent on a difference in the mechanical stress at the first Hall sensor 53 and the second Hall sensor 55.

Here, an implicit low-pass function or a band limitation of the difference calculation means 65 and/or of the first analog-digital converter 67, respectively, can be taken advantage of, and the directions of the currents in the Hall sensors 53, 55 can be switched or toggled at sufficiently high velocity or sufficiently high clock rate via the changeover switching means not shown here, so that the frequency of the changeover switching means is high in relation to the cutoff frequency of the low-pass of the difference calculation means 65 and of the second analog-digital converter 69. A mean value of a difference of the supply potential of the first Hall sensor 53 and of the second Hall sensor 55 thus detected hence is dependent on a difference of the mechanical stresses at the first Hall sensor 53 and at the second Hall sensor 55, so that the stress measurement resistors $R_{n1}$ and $R_{n2}$ may be omitted.

Figure 3B:
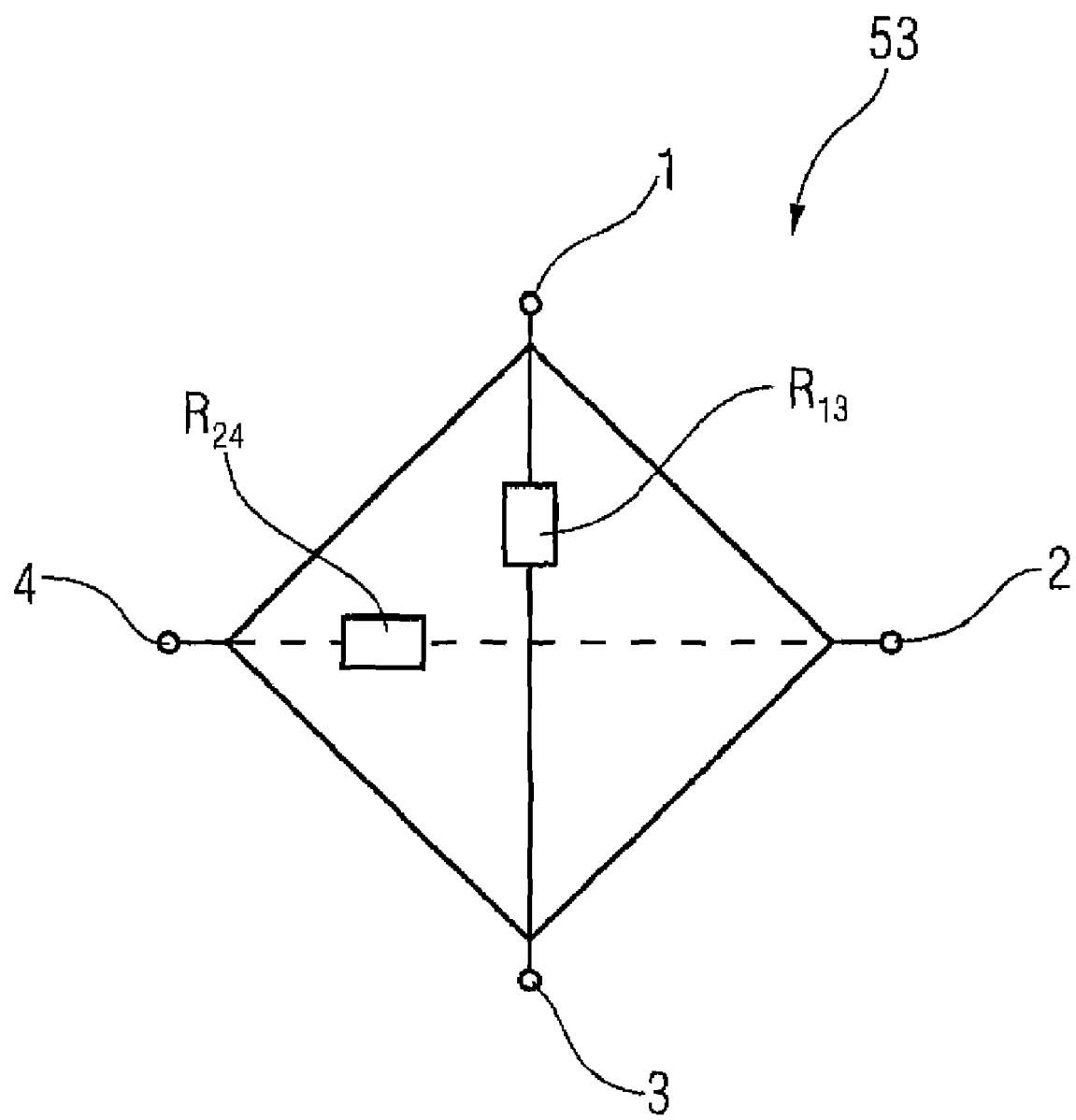
FIG. 3b is a schematic view of the stress-dependent resistances occurring in a symmetrical Hall sensor.

The principle of employing the Hall sensors 53, 55 as spinning current sensors is especially advantageous if the Hall sensors 53, 55 or Hall probes have 90° symmetry, i.e., transition into themselves at a rotation over 90° around their point of symmetry. The symmetrically formed Hall sensors 53, 55 may here be square or circular, for example, or may have a shape of any symmetrical cross or octagon. FIG. 3b explains a construction of the symmetrical Hall sensor 53, 55. If it is desired to determine, apart from the magnetical field, at the same time the stress with the Hall sensor 53, 55 thus formed, one attaches four contacts or taps, which are numbered with the numbers 1, 2, 3, 4 in clockwise manner in FIG. 3b, at the Hall sensor thus formed or the Hall probe thus formed. Then, one measures an ohmic resistance $R_{13}$ between the terminals 1, 3. Then, an ohmic resistance $R_{24}$ between the also opposite terminals 2, 4 is determined.

In the symmetrically formed probe or the symmetrical Hall sensor 53, in a state in which no mechanical stress is present at the Hall sensor 53, the resistances $R_{13}$, $R_{24}$ between the diagonally arranged taps 1, 2, 3, 4 are equal or equal to within a tolerance of about 10%, so that $R_{13}=R_{24}$ applies.

But if mechanical stress acts on the symmetrical Hall sensor 53, the two ohmic resistances $R_{13}$, $R_{24}$ have different values, so that the following connection applies: $R_{13} \neq R_{24}$ For the sum of the two stress-dependent resistances $R_{13}$ and $R_{24}$, however, the following connection applies:

$$R_{13}+R_{24}=R \cdot [1+\pi_n(\sigma_{xx}+\sigma_{yy})] \quad (16)$$

Thus, in the symmetrical Hall sensors 53, 55, the sum of the two resistances $R_{13}$, $R_{24}$ between the respective diagonally opposite terminals only depends on the sum of the normal tension components $\sigma_{xx}$, $\sigma_{yy}$ acting on the Hall sensors 53, 55. Similar to the stress sensors 57, 59, which also consist of two components, namely a vertical and a horizontal resistance component connected in series, thus again the already-mentioned connection applies that the resistance depends on a sum of the normal tensions $\sigma_{xx}$, $\sigma_{yy}$. In other words, in the spinning current method, at first the resistance of the probes or Hall sensors 53, 55 passing in vertical direction can be detected, and then the resistance of the probes or Hall sensors 53, 55 passing in horizontal direction can be measured, and then the quantities thus measured can be added up in the DSP 71 and be evaluated.

Figure 4:
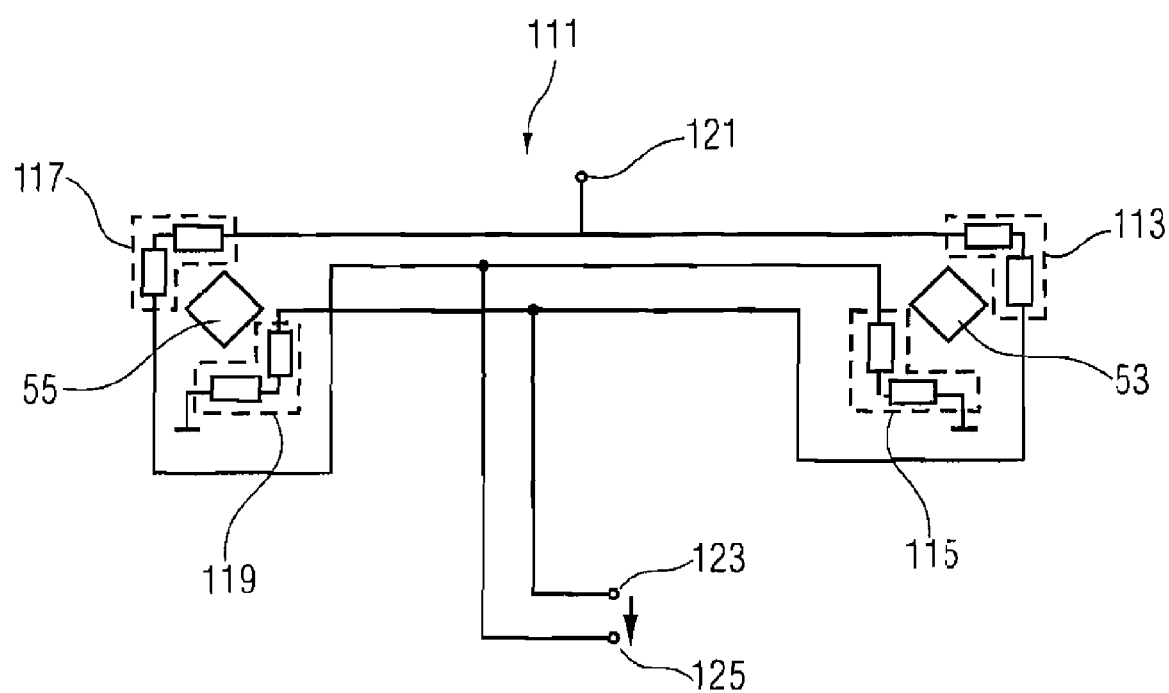
FIG. 4 shows an arrangement of stress sensors in a magnetic field sensor apparatus according to one embodiment of the present invention.

In FIG. 4, there is shown a stress measurement bridge 111, which may, for example, be employed in the Hall sensor apparatus 51 according to a second embodiment of the present invention so as to increase sensitivity of the determination of the stress difference $(\sigma_2-\sigma_1)$ between the stress $\sigma_1$ a the first Hall sensor 53 and the stress $\sigma_2$ at the second Hall sensor 55. The stress measurement bridge 111 comprises a stress sensor 113 for determining a first stress $\sigma_1$, a further stress sensor 115 for determining the first stress $\sigma_1$, a stress sensor 117 for determining the second stress $\sigma_2$, and a further stress sensor 119 for determining the second stress $\sigma_2$.

The first stress $\sigma_1$ occurs, as already explained, at the first Hall sensor 53, whereas the second stress $\sigma_2$ occurs at the second Hall sensor 55. The stress sensor 113 and the further stress sensor 115 each are arranged more closely to the first Hall sensor 53 than to the second Hall sensor 55 here. A distance of the stress sensor 113 and the stress sensor 115 from the first Hall sensor 53 may here be so small that a difference between a stress at the stress sensors 113, 115 and the stress $\sigma_1$ at the first Hall sensor 53 is in a range of less than 0.2 times a difference between the stress $\sigma_1$ at the first Hall sensor 53 and the stress $\sigma_2$ at the second Hall sensor 55.

Moreover, the stress sensor 117 and the further stress sensor 119 each are arranged closer to the second Hall sensor 55 than to the first Hall sensor 53. A distance of the stress sensor 117 and the stress sensor 119 each from the second Hall sensor 55 may here be so small that a difference between a stress at the stress sensors 117, 119 and the stress $\sigma_2$ at the second Hall sensor 55 is in a range of less than 0.2 times a difference between the stress $\sigma_1$ at the first Hall sensor 53 and the stress $\sigma_2$ at the second Hall sensor 55.

Here, the first Hall sensor 53 is arranged between the stress sensors 113, 115, whereas the second Hall sensor 55 is arranged between the stress sensors 117, 119. The stress sensor 113 consists of two ohmic resistors, which are implemented as an elongated doped zone on a substrate, for example, and are arranged at an angle ranging from about 80° to about 100° with respect to each other. The same applies for the further stress sensor 115, which also consists of two elongated doped zones forming an angle ranging from about 80° to about 100°. The elongated doped zones here each comprise an n-doping, for example. The stress sensor 117 and/or the stress sensor 119 here are implemented in the same manner as the stress sensors 113, 115.

The stress sensor 113 for determining the first stress is connected, at a first terminal, to an input terminal 121 of the stress measurement bridge 111 and, at a second terminal, to a first terminal of the further stress sensor 119 for determining the second stress sensor $\sigma_2$, as well as to a first output terminal 123 of the stress measurement bridge 111. The further stress sensor 119 is coupled, at a second terminal, to the ground terminal. At the same time, the input terminal 121 is connected to a first terminal of the stress sensor 117 for determining the second stress. Moreover, a second terminal of the stress sensor 117 for determining the second stress is coupled to a first terminal of the further stress sensor 115 for determining the first stress as well as a second output terminal 125 of the stress measurement bridge 111. The further stress sensor 115 for determining the first stress $\sigma_1$ is coupled, at a second terminal, to the ground terminal.

The stress sensors 113, 115, 117, 119 each are connected in a half bridge for the stress sensors for determining the first stress and the second stress, respectively. In other words, the stress sensors 113, 115 for determining the first stress $\sigma_1$ at the first Hall sensor 53 are arranged in a main diagonal of the stress measurement bridge 111, whereas the stress sensor 117, 119 for determining the second stress $\sigma_2$ at the second Hall sensor 55 are arranged in a minor diagonal of the stress measurement bridge 111. A voltage or bridge output signal of the stress measurement bridge 111 tapped between the first output terminal 123 and the second output terminal 125 may again be evaluated by means of the difference calculation means 65. Thus, the difference calculation means 65 generated an analog stress sensor difference signal based on the tapped voltage. For the voltage between the first output terminal 123 and the second output terminal 125, the connection illustrated in equation (17) applies here:

$$U_\sigma = U_0 \frac{R_{n1}(T_1, \sigma_1) - R_{n2}(T_2, \sigma_2)}{R_{n1}(T_1, \sigma_1) + R_{n2}(T_2, \sigma_2)} \quad (17)$$

In equation (17), the variable $U_0$ represents an input voltage of the stress measurement bridge 111, whereas the variable $R_{n1}$ represents an ohmic resistance of the stress sensors for determining the first stress 113, 115, wherein the stress sensors 113, 115 are formed so that they have the same resistance value. Furthermore, in equation (17), the variable $R_{n2}$ represents the resistance of the stress sensors 117, 119 for determining the second stress $\sigma_2$, wherein the two stress sensors 117, 119 have the same resistance value here. The equation (17) may then again be linearized in similar manner to the deduction illustrated in equations (1)-(15), whereby an equation results, with which a ratio of the magnetic field $B_2$ at the second Hall sensor 55 to a magnetic field $B_1$ at the first Hall sensor 53 can be determined from the output signal of the stress measurement bridge, the temperature sensor difference signal $S_{T}$, and the output signals $S_{h,1}$, $S_{h,2}$ of the Hall sensors 53, 55 as well as the material parameters.

Figure 5:
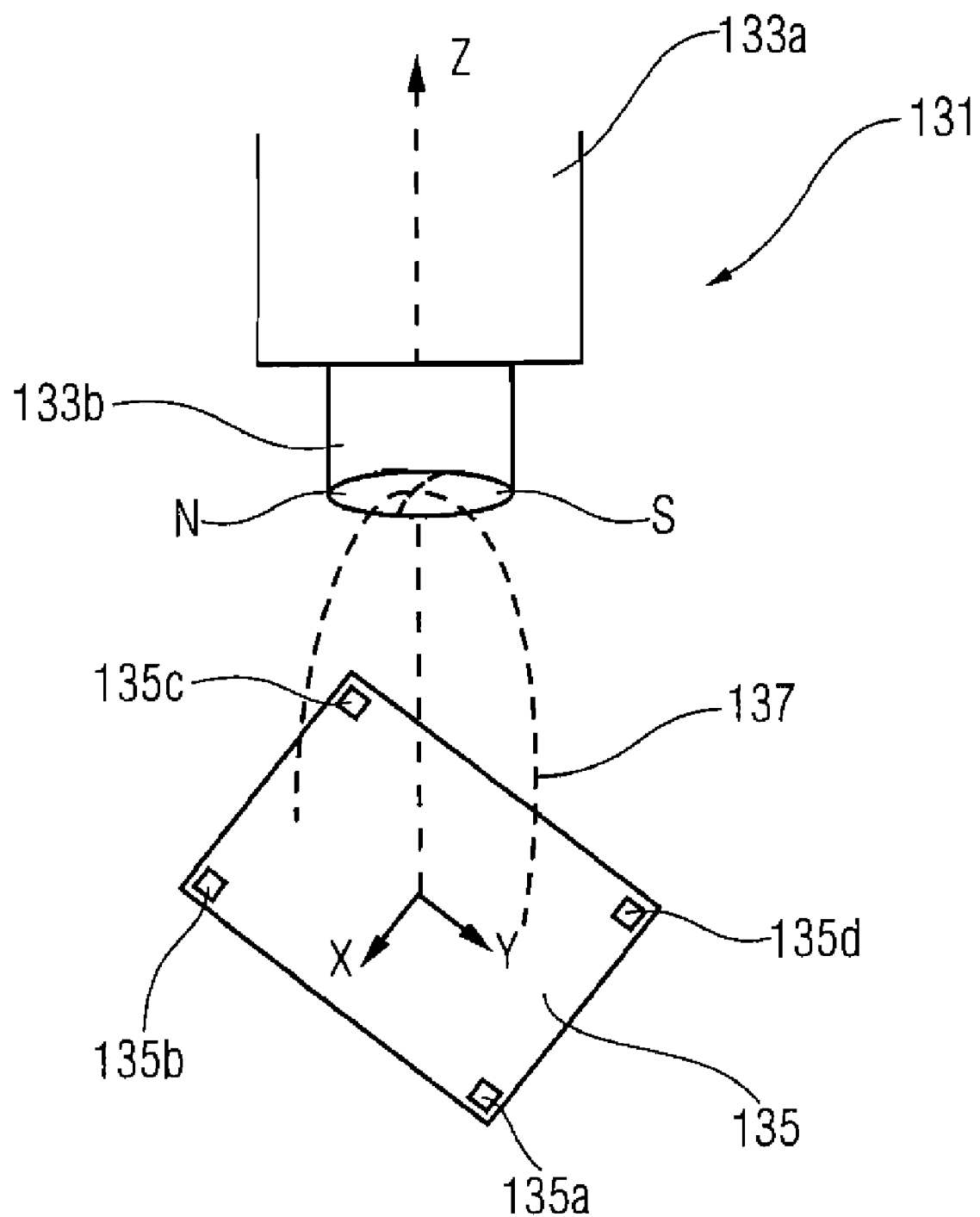
FIG. 5 shows an angle sensor with a magnetic field sensor apparatus according to one embodiment of the present invention.

FIG. 5 explains an angle measurement means 131 detecting an angle of rotation of a rotating body 133a with a rotating magnet 133b by means of a magnetic field sensor apparatus 135 or Hall sensor apparatus 135 according to an embodiment of the present invention. In the following, a possibility of employment of the Hall sensor apparatus according to an embodiment of the present invention thus is to be explained. The body 133a rotates about a z axis, which is shown in FIG. 5. On a front side of the body 133a, there is mounted a small magnet or the rotating magnet 133b, which may, for example, be implemented in a flat and cylindrical manner. For example, the magnet is diametrically magnetized, i.e., the magnetization is perpendicular to the z axis. For example, the magnetization could be in the direction of an x axis shown in FIG. 5, so that the rotating magnet 133b comprises a south pole S and a north pole N shown in FIG. 5.

The Hall sensor apparatus 135 is positioned in an xy plane in the angle measurement means 131, which is identical with the chip plane of the Hall sensor apparatus 135, so that the axis of rotation or z axis is perpendicular to the chip, or the axis of rotation and the chip plane form an angle ranging from about 80° to 100°. As shown in FIG. 5, four Hall sensors 135a, 135b, 135c, 135d are arranged on the chip or the Hall probe apparatus 135, wherein an air gap lies between the rotating magnet 133b and the Hall sensor apparatus 135, so that the rotating magnet 133b is spaced from the chip surface of the Hall sensor apparatus 135. A distance of the rotating magnet 133b from the chip surface here ranges from about 1 to about 5 mm, for example. The Hall sensors 135a, 135b, 135c, 135d each are arranged closely to the corners of the chip with the Hall sensor apparatus 135, wherein an expansion of the chip in x direction or a direction parallel to the x axis is $2L_x$, and in y direction or a direction parallel to the y axis is $2L_y$.

The Hall sensors 135a, 135b, 135c, 135d here each are only capable of detecting a z component of a magnetic field line 137. For a value $B_z$ of a z component of a magnetic field, the following applies: $B_z(x, y, z)=B_0 \cdot x$ Here, $B_0$ is a value of a magnetic field at the respective Hall sensors 135a-135d occurring in an inclined plane, for which the following connections apply:

For the Hall probe 135a, which is arranged at coordinates $x=L_x$, $y=L_y$, the following connection: $H_1=B_0 \cdot L_x$ applies for a value of the magnetic field $H_1$ at the first Hall sensor 135a.

For a magnetic field $H_2$ at the Hall 135b at the coordinates $x=L_x$, $y=-L_y$, the following connection applies: $H_2=B_0 \cdot L_x$ A magnetic field $H_3$ at the third Hall probe 135c at the coordinates $x=-L_x$, $y=L_y$, can be determined as follows: $H_3=-B_0 \cdot L_x$ A magnetic field $H_4$ at the fourth Hall probe 135d at the coordinates $x=-L_x$ and $y=-L_y$, can be determined from: $H_4=-B_0 \cdot L_x$ When the body 133a with the rotating magnet 133b rotates about the z axis, so that a magnetization forms an angle φ with the x axis, the inclined plane, in which the magnetic field lines are, also rotates.

Thus, the z component $B_z$ basically can be determined according to the following connection depending on the x,y coordinates of the positions of the Hall sensors 135a-135d:

$$B_z(x,y,z,\phi)=B_0 \cdot [cos(\phi) \cdot x + sin(\phi) \cdot y] \quad (18)$$

Hence, for the first Hall sensor 135a, the following applies:

$$H_1=B_0 \cdot [cos(\phi) \cdot L_x + sin(\phi) \cdot L_y] \quad (18a)$$

At the second Hall probe 135b, the following connection applies:

$$H_2=B_0 \cdot [cos(\phi) \cdot L_x - sin(\phi) \cdot L_y] \quad (18b)$$

For the magnetic field at the third Hall probe 135c, the following connection applies:

$$H_3=B_0 \cdot [-cos(\phi) \cdot L_x + sin(\phi) \cdot L_y] \quad (18c)$$

For the magnetic field at the fourth Hall probe 135d, the following connection applies:

$$H_4=B_0 \cdot [-cos(\phi) \cdot L_x - sin(\phi) \cdot L_y] \quad (18d)$$

By means of the above equations (18a)-(18d), a tangent function with the angle φ can be deduced, wherein:

$$\frac{H_1 - H_2}{H_1 + H_2} = \tan\varphi \quad (19)$$

The angle φ can be determined according to the following connection:

$$\varphi = \arctan\left(\frac{1 - \frac{H_2}{H_1}}{1 + \frac{H_2}{H_1}}\right) \quad (20)$$

From the above equations, it becomes obvious that an φ of the magnetic field can be determined from a ratio $H_2/H_1$. Since the tangent function in the range from about 0° to about 360°, however, is ambiguous, that is two angle values are associated with one value of the arc tangent function, it is necessary that the signals of the four Hall probes 135a-135d are evaluated in a downstream evaluation means. The angle value pairs each determined from two pairs 135a-135b and 135c-135d are compared, in a downstream comparison means, with value pairs deposited there, so that a unique association or detection of the angle of rotation φ is possible.

In the Hall sensor apparatuses 51, 101 and the stress measurement bridge 111, the stress sensors each are formed as two n-doped resistors or n-doped zones, which are arranged at an angle ranging from about 80° to about 100° with respect to each other, in a Hall sensor apparatus according to an embodiment of the present invention. The n-doped resistors here are formed, e.g., as diffusion or implantation resistors, which are connected in series in the Hall sensor apparatus 51 and the stress measurement bridge 111. The n-doped zones in the Hall sensor apparatuses 51, 101 and in the stress measurement bridge 111 are embedded in a (100)-silicon substrate in one embodiment of the present invention. Here, the n-doped zones of the ohmic resistors each have an elongated shape. But any implementations of the stress sensors in a Hall sensor apparatus according to a further embodiment of the present invention are possible, or any implementations of the ohmic resistors, e.g., also as a p-doped zone, e.g., also in any substrate, such as a (111)-silicon substrate. It is also possible here, e.g., to implement a stress sensor by a parallel connection of two ohmic resistors each implemented in a doped zone.

In the Hall sensor apparatus 101 according to an embodiment of the present invention, the mechanical stress at the Hall sensors 53, 55 is determined via a voltage present at the Hall sensors 53, 55, wherein the current is impressed on the Hall sensors 53, 55. To this end, the first Hall sensor 13, 53 and the first stress sensor 16a, 57 each are implemented in a single device and/or arranged at an identical location, or the second Hall sensor 15, 55 and the second stress sensor 17, 59 each are implemented in a single device and/or arranged at an identical location. But the stress sensors 16a, 17, 57, 59 and the Hall sensors 13, 15, 53, 55 each may also be implemented as separate devices.

In the stress measurement bridge 111, the four stress sensors 113, 115, 117, 119 each are arranged so that the Hall sensor 53 is arranged between the stress sensors 113, 115, and the Hall sensor 55 between the stress sensors 117 and 119. But any arrangements of the stress sensors 113, 115 and the stress sensors 117, 119, respectively, with respect to the Hall sensors 53, 55 are possible, as long as the stress sensors 113, 115 are arranged more closely to the first Hall sensor 53 than to the second Hall sensor 55, and the stress sensors 117, 119 more closely to the second Hall sensor 55 than to the first Hall sensor 53.

As an alternative to the arrangement and connection of the stress sensors 57, 59 shown in the Hall sensor apparatus 51, the stress sensors, which consist of the stress measurement resistors $R_{n1}$ and $R_{n2}$, may also be implemented as a series connection of the two stress sensors 57, 59 and the stress measurement resistors $R_{n1}$ and $R_{n2}$, respectively, wherein a reference voltage could be applied to the series connection thus implemented. Based on a value of the potential at the connection node between the two resistors $R_{n1}$, $R_{n2}$, then the difference between the mechanical stress at the first Hall sensor 53 and the mechanical stress at the second Hall sensor 55 could be determined. Then, e.g., a difference between the voltage drop between the connection node and the ground terminal and half the reference voltage would be determined, and the voltage difference thus determined be converted into a stress measurement signal.

Furthermore, the DSP 71 in the Hall sensor apparatuses 51, 101, in a Hall sensor apparatus according to a further embodiment of the present invention, could be replaced by any evaluation means that, e.g., would also be capable of processing analog stress difference signals or analog temperature difference signals. In the Hall sensor apparatuses 51, 101, the DSP 71 reads out the material parameters from a ROM, but it also would be possible to determine the material parameters not within the scope of a characterization of the Hall sensor apparatuses 51, 101, but determine same only in the calibration of the Hall sensor apparatuses 51, 101 and then deposit same in a programmable memory, such as an EEPROM or an OTP (one-time programmable) memory.

In the Hall sensor apparatuses 51, 101, the temperature sensors 61, 63 are implemented as PTAT bandgap circuits, but the temperature sensors 61, 63 could be implemented in any form, such as NTC (negative temperature coefficient) resistors.

Furthermore, in the Hall sensor apparatuses 11, 51, 101, the Hall sensors 13, 15, 53, 55 are arranged on the chip in spaced manner from each other, so that a difference of the first Hall sensor 13, 53 from the second Hall sensor 15, 55 is in a range above about 0.5 times a root of the chip area. But in Hall sensor apparatuses according to a further embodiment of the present invention any arrangements of the Hall sensors 53, 55 on the chip are alternatives hereto.

The Hall sensor apparatuses 51, 101 serve to perform an angle measurement of a magnetic field, but the Hall sensor apparatuses 51, 101 could be employed in any applications in which a determination of the ratio or a relation of the magnetic fields at the first Hall sensor 53 and at the second Hall sensor 55 with respect to each other is performed. Here, the employment of the Hall sensor apparatuses 51, 101 in so-called switch sensors, which are employed to detect the rotational speed or the position of a gear, and in which two or three Hall probes are at a distance of a gear module on a chip, also would be advantageous. In these switch sensors, e.g., the accuracy with respect to their switching point and jitter could then be improved.

The Hall sensor apparatuses 11, 51, 101, e.g., comprise a position evaluation means, in order to determine a position of a magnetic body with respect to the substrate based on an output signal $S_{h,1}$ of the first Hall sensor and an output signal $S_{h,2}$ of the second Hall sensor. Here, e.g., by means of an arc tangent function of a ratio of a value of the output signal of the first Hall sensor to a value of the output signal of the second Hall sensor, an angle of rotation could be determined. But any applications of the Hall sensor apparatuses 11, 51, 101 are alternatives hereto.

In the Hall sensor apparatuses 51, 101, the DSP 71 determines the ratio of the magnetic field at the first Hall sensor 53 to the magnetic field at the second Hall sensor 55 based on the output signals $S_{h,1}$, $S_{h,2}$ of the Hall sensors 53, 55, the difference signals $S_O$, $S_T$ from the temperature sensors 61, 63 and the stress sensors 57, 59, taking differences in temperatures of the Hall sensors 53, 55 and the mechanical stresses at the Hall sensors 53, 55 into account. Here, it is the aim that the influence of the difference in temperatures or the influence of the difference in mechanical stresses at the Hall sensors 53, 55 on the determined ratio of the magnetic fields with respect to each other is reduced.

In the Hall sensor apparatuses 51, 101, the current mirror transistors are dimensioned so that the Hall currents through the Hall sensors 53, 55 are, to within a tolerance of about 10%, equal to a current through the stress sensor 57 or the stress sensor 59, but any ratios of the currents through the Hall sensors 53, 55 to the currents through the stress sensors 57, 59 are alternatives hereto. Advantageously, in a Hall sensor apparatus according to a further embodiment of the present invention, even the current mirror circuit 79 is dimensioned so that the current through the current measurement resistors or the stress sensors 57, 59 indeed is proportional to, but smaller than the currents through the Hall sensors 53, 55 by a defined factor, in order to reduce power consumption of the Hall sensor apparatuses 51, 101.

The first stress sensor 16a may be arranged on the substrate 21 so closely to the first Hall sensor 13 that the difference between the mechanical stress at the first Hall sensor 13 and the mechanical stress at the first stress sensor 16a is smaller than about 0.2 times the stress difference between the mechanical stress at the first Hall sensor 13 and the mechanical stress at the second Hall sensor 15. The second stress sensor 17 may be arranged so closely to the second Hall sensor 15 that a difference between the mechanical stress at the second stress sensor 17 and the mechanical stress at the second Hall sensor 15 is smaller than about 0.2 times the difference of the mechanical stress at the first Hall sensor 13 and the mechanical stress at the second Hall sensor 15. But any arrangements of the first stress sensor 13, 53 and of the second stress sensor in relation to the first Hall sensor and the second Hall sensor are alternatives, as long as the first stress sensor is arranged closer to the first Hall sensor than to the second Hall sensor, and the second stress sensor is arranged closer to the second Hall sensor than to the first Hall sensor.

The first temperature sensor 16b may be arranged on the substrate 21 so closely to the first Hall sensor 13 that the difference between the temperature at the first temperature sensor 16b and the temperature at the first Hall sensor 13 is less than about 0.2 times the temperature difference between the temperature at the first Hall sensor 13 and the temperature at the second Hall sensor 15. At the same time, the second temperature sensor 19 may be arranged on the substrate 21 so closely to the second Hall sensor 15 that a temperature difference between the second temperature sensor 19 and the second Hall sensor 15 is less than about 0.2 times the temperature difference between the first Hall sensor 13 and the second Hall sensor 15. But any arrangements of the first temperature sensor 16b, 61 and of the second temperature sensor 19, 63 in relation to the first Hall sensor 13, 53 and the second Hall sensor 15, 55 are alternatives, as long as the first temperature sensor is arranged more closely to the first Hall sensor than to the second Hall sensor, and the second temperature sensor is arranged more closely to the second Hall sensor than to the first Hall sensor.

In the magnetic field sensor apparatus 51 shown in FIG. 2, the currents through the stress sensors 57, 59 and through the Hall sensors 53, 55 may also be chosen so that they differ from each other, wherein the deviations resulting therefrom can be corrected for or calculated out correspondingly in the DSP 71. In a magnetic field sensor apparatus 51 according to a further embodiment of the present invention, it is advantageous to adjust the currents impressed in the stress sensors 57, 59, so that the currents through the stress sensors 57, 59 are less than the currents through the Hall sensors 53, 55, in order to reduce current consumption of the magnetic field sensor apparatus 51.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A magnetic field sensor apparatus, comprising:
a first magnetic field sensor and a second magnetic field sensor, arranged on a substrate in a spaced manner from each other;
a first temperature sensor with an output for a first temperature sensor signal;
a second temperature sensor with an output for a second temperature sensor signal;
a first stress sensor with an output for a first stress sensor signal; and
a second stress sensor with an output for a second stress sensor signal;
wherein the first temperature sensor and the first stress sensor are arranged more closely to the first magnetic field sensor than to the second magnetic field sensor, and the second temperature sensor and the second stress sensor are arranged more closely to the second magnetic field sensor than to the first magnetic field sensor.

2. The magnetic field sensor apparatus according to claim 1, wherein the first temperature sensor is arranged so closely to the first magnetic field sensor, and the second temperature sensor is arranged so closely to the second magnetic field sensor that a temperature difference between a temperature at the first temperature sensor and a temperature at the first magnetic field sensor and a temperature difference between a temperature at the second temperature sensor and a temperature at the second magnetic field sensor each are in a range of less than 0.2 times a temperature difference between the temperature at the first magnetic field sensor and the temperature at the second magnetic field sensor.

3. The magnetic field sensor apparatus according to claim 1, wherein the first stress sensor is arranged so closely to the first magnetic field sensor and the second stress sensor is arranged so closely to the second magnetic field sensor that a stress difference between a stress at the first stress sensor and a stress at the first magnetic field sensor and a stress difference between a stress at the second stress sensor and a stress at the second magnetic field sensor each are in a range of less than 0.2 times a stress difference between the stress at the first magnetic field sensor and the stress at the second magnetic field sensor.

4. The magnetic field sensor apparatus according to claim 1, further comprising:
an evaluator;
wherein the first magnetic field sensor comprises a first output for a first magnetic field sensor signal, and the second magnetic field sensor comprises an output for a second magnetic field sensor signal;
wherein the evaluator comprises an input for the first temperature sensor signal, an input for the second temperature sensor signal, an input for the first stress sensor signal, an input for the second stress sensor signal, and an output for an output signal;
wherein a value of the output signal of the evaluator depends on a ratio of a value of the first magnetic field sensor signal to a value of the second magnetic field sensor signal, the first stress sensor signal, the second stress sensor signal, the first temperature sensor signal and the second temperature sensor signal; and
wherein the output signal provides a determined value of a ratio of a first magnetic field at the first magnetic field sensor to a magnetic field at the second magnetic field sensor, so that an influence of a temperature difference between a temperature at the first magnetic field sensor and a temperature at the second magnetic field sensor and of a stress difference between a stress at the first magnetic field sensor and a stress at the second magnetic field sensor is reduced to the determined value of the ratio.

5. The magnetic field sensor apparatus according to claim 4, wherein the evaluator comprises a temperature difference calculator with an input for the first temperature sensor signal, an input for the second temperature sensor signal and an output for a temperature difference signal dependent on a difference of a value of the first temperature sensor signal and a value of the second temperature sensor signal.

6. The magnetic field sensor apparatus according to claim 5, wherein the evaluator comprises a stress difference calculator with an input for the first stress sensor signal, an input for the second stress sensor signal and an output for a stress difference signal dependent on a difference of a value of the first stress sensor signal and a value of the second stress sensor signal.

7. The magnetic field sensor apparatus according to claim 6, wherein the evaluator comprises a magnetic field ratio determinator with an input for the first magnetic field sensor signal, an input for the second magnetic field sensor signal and an output for a magnetic field ratio signal dependent on a ratio of the value of the first magnetic field sensor signal to the value of the second magnetic field sensor signal.

8. The magnetic field sensor apparatus according to claim 7, wherein the evaluator comprises a calculator with an input for the temperature difference signal, an input for the stress difference signal, an input for the magnetic field ratio signal and an output for a compensation signal;
wherein a value of the compensation signal depends on a value of the temperature difference signal, a value of the stress difference signal and a value of the magnetic field ratio signal, so that the value of the compensation signal corresponds to a value of the magnetic field ratio signal multiplied by a rational function of a numerator and a denominator polynomial with fixed coefficients and powers;
wherein the fixed coefficients and powers comprise coefficients and powers of the temperature difference between the temperature of the first magnetic field sensor and the temperature of the second magnetic field sensor and the stress difference between the stress at the first magnetic field and the stress at the second magnetic field sensor.

9. The magnetic field sensor apparatus according to claim 1, wherein a distance between the first magnetic field sensor and the second magnetic field sensor is in a range above 0.5 times a root of a chip area of a chip on which the first magnetic field sensor and the second magnetic field sensor are arranged.

10. The magnetic field sensor apparatus according to claim 1, wherein the first stress sensor comprises a first elongated doped zone and a second elongated doped zone, in which a doping each is higher than a basic doping of the substrate in which the first stress sensor is implemented, or which comprise a doping type opposite to the basic doping, wherein the first elongated doped zone and the second elongated doped zone are arranged at an angle ranging from 80° to 100° with respect to each other.

11. The magnetic field sensor apparatus according to claim 1, wherein the first stress sensor and the first magnetic field sensor are implemented in a single device, wherein the magnetic field sensor apparatus comprises an input for an impressed current and a tap for a potential, the value of which depends on the impressed current and a mechanical stress at the first magnetic field sensor.

12. The magnetic field sensor apparatus according to claim 11, wherein the second stress sensor comprises a first elongated doped zone and a second elongated doped zone, in which a doping each is higher than a basic doping of the substrate in which the second stress sensor is implemented, or which comprise a doping type opposite to the basic doping, wherein the elongated doped zones are arranged at an angle ranging from 80° to 100° with respect to each other.

13. The magnetic field sensor apparatus according to claim 10, wherein the second stress sensor and the second magnetic field sensor are implemented in one device, and the second magnetic field sensor comprises an input for a further impressed current and a tap for a further potential, the value of which depends on the further impressed current and the mechanical stress at a second Hall sensor.

14. The magnetic field sensor apparatus according to claim 1, further comprising a third stress sensor arranged on the substrate more closely to the first magnetic field sensor than to the second magnetic field sensor, so that the first magnetic field sensor is arranged between the first stress sensor and the third stress sensor.

15. The magnetic field sensor apparatus according to claim 14, wherein the third stress sensor comprises two elongated doped zones, the doping of which each is higher than a basic doping of the substrate in which the third stress sensor is implemented, or which comprise a doping type different from the basic doping, wherein the two elongated doped zones are arranged at an angle ranging from 80° to 100°.

16. The magnetic field sensor apparatus according to claim 14, further comprising a fourth stress sensor, which is arranged on the substrate more closely to the second magnetic field sensor than to the first magnetic field sensor, so that the second magnetic field sensor is arranged between the second stress sensor and the fourth stress sensor.

17. The magnetic field sensor apparatus according to claim 16, wherein the fourth stress sensor comprises two elongated doped zones, the doping of which each is higher than a basic doping of the substrate in which the fourth stress sensor is implemented, or which comprise a doping type different from the basic doping, wherein the two elongated doped zones are arranged at an angle ranging from 80° to 100°.

18. The magnetic field sensor apparatus according to claim 17, wherein the first, the second, the third and the fourth stress sensor each comprise a first and a second terminal;
wherein the first, the second, the third and the fourth stress sensor are coupled together in a bridge circuit;
wherein a first terminal of the first stress sensor is electrically connected to a first terminal of the second stress sensor in effective manner, and a second terminal of the first stress sensor is electrically connected to a first terminal of the fourth stress sensor in effective manner;
wherein a second terminal of the second stress sensor is electrically connected to a first terminal of the third stress sensor in effective manner, and a second terminal of the third stress sensor is electrically connected to a second terminal of the fourth stress sensor in effective manner; and
wherein the second terminal of the third stress sensor and the first terminal of the second stress sensor form an input for an input signal of the bridge circuit, and the second terminal of the first stress sensor and the second terminal of the second stress sensor form an output for an output signal of the bridge circuit, the value of which is dependent on a difference of a stress at the first magnetic field sensor and a stress at the second magnetic field sensor.

19. The magnetic field sensor apparatus according to claim 1, wherein the first magnetic field sensor and the second magnetic field sensor are arranged on the substrate so that, when applying a first input voltage to the first magnetic field sensor, a first impressed current flows and, when applying a second input voltage to the second magnetic field sensor, a second impressed current flows, wherein the first impressed current and the second impressed current form an angle ranging from 170° to 190° or ranging from 350° to 10°.

20. The magnetic field sensor apparatus according to claim 1, wherein the first temperature sensor comprises a first band-gap circuit with an output for the first temperature sensor signal, the value of which is proportional to an absolute temperature at the first magnetic field sensor.

21. The magnetic field sensor apparatus according to claim 1, wherein the second temperature sensor comprises a second band-gap circuit with an output for the second temperature sensor signal, the value of which is proportional to an absolute temperature at the second magnetic field sensor.

22. The magnetic field sensor apparatus according to claim 8, wherein the calculator comprises the output for the compensation signal, the value of which depends on the following formula:

$$V_3 = \frac{S_{h,2}(T_2)}{S_{h,1}(T_1)} \frac{1}{1 + \kappa(T)\frac{(S_\sigma - \mu_\sigma)\zeta(T) - (S_T - \mu_T)\pi_n(T)}{\varepsilon'\zeta(T) - \delta'\pi_n(T)} + P(T)\frac{(S_T - \mu_T)\varepsilon' - (S_\sigma - \mu_\sigma)\delta'}{\varepsilon'\zeta(T) - \delta'\pi_n(T)}} = \frac{B_2}{B_1}$$

wherein $V_3$ represents a value of the ratio, $T_1$ represents a value of the temperature at the first magnetic field sensor, $T_2$ represents a value of the temperature at the second magnetic field sensor, $B_1$ defines a value of the magnetic field at the first magnetic field sensor, $B_2$ defines a value of the magnetic field at the second magnetic field sensor, $S_{h,1}$ represents a value of the first magnetic field sensor output signal, $S_{h,2}$ represents a value of the second magnetic field sensor output signal, $\kappa(T)$ represents a value of a normalized differential current-related magnetic sensitivity of the magnetic field sensor apparatus, $S_T$ represents a value of the temperature difference signal, for which the following applies:

$S_T = S_{T2} - S_{T1}$ wherein $S_{T2}$ represents a value of the second temperature sensor signal, $S_{T1}$ represents a value of the first temperature sensor signal, and $S_\sigma$ represents a value of the stress difference signal, wherein $S_\sigma = S_{\sigma 2} - S_{\sigma 1}$ wherein $S_{\sigma 1}$ indicates a value of the first stress sensor signal, $S_{\sigma 2}$ indicates a value of the second stress sensor signal;

wherein a variable P(T) indicates a value of a temperature-dependent piezo Hall coefficient of the magnetic field sensor apparatus, $\mu_\tau$ represents a value of the temperature difference signal $S_T$ if the temperature $T_1$ at the first magnetic field sensor and the temperature $T_2$ at the second magnetic field sensor are equal to within a tolerance of 2%, the variable $\mu_\sigma$ represents a value of the difference signal $S_\sigma$ if the mechanical stress at the first magnetic field sensor is equal to the mechanical stress at the second magnetic field sensor to within a tolerance of 2%; and wherein the variable $\zeta(T)$ represents a temperature-dependent value of a stress dependence of the value $S_T$ of the temperature difference signal, $\epsilon'$ indicates a temperature dependence of the value $S_\sigma$ of the stress difference signal, $\delta'$ indicates a temperature sensor sensitivity of the magnetic field sensor apparatus, $\pi_n$ indicates a value of the piezoresistive coefficient of the magnetic field sensor apparatus, and the variable T represents a mean temperature of the substrate.

23. The magnetic field sensor apparatus according to claim 1, wherein the first temperature sensor and the first stress sensor are arranged at a location identical with the first magnetic field sensor.

24. The magnetic field sensor apparatus according to claim 1, wherein the second temperature sensor and the second stress sensor are arranged at a location identical with the second magnetic field sensor.

* * * * *